(12) United States Patent
Kim et al.

(10) Patent No.: US 8,637,345 B2
(45) Date of Patent: Jan. 28, 2014

(54) METHODS OF FABRICATING DEVICES BY LOW PRESSURE COLD WELDING

(75) Inventors: Changsoon Kim, Princeton, NJ (US);
Stephen R. Forrest, Princeton, NJ (US)

(73) Assignee: The Trustees Of Princeton University, Princeton, NJ (US)

( * ) Notice: Subject to any disclaimer, the term of this patent is extended or adjusted under 35 U.S.C. 154(b) by 0 days.

(21) Appl. No.: 13/525,539

(22) Filed: Jun. 18, 2012

(65) Prior Publication Data

US 2012/0295425 A1  Nov. 22, 2012

Related U.S. Application Data

(62) Division of application No. 10/387,925, filed on Mar. 13, 2003, now Pat. No. 8,222,072.

(60) Provisional application No. 60/435,350, filed on Dec. 20, 2002.

(51) Int. Cl.
H01L 51/40 (2006.01)

(52) U.S. Cl.
USPC .......... 438/99; 438/455; 257/E21.09

(58) Field of Classification Search
USPC ........... 438/99, 455, 457, 458; 257/E21.09
See application file for complete search history.

(56) References Cited

U.S. PATENT DOCUMENTS

| 3,139,678 A | 7/1964 | Anthony |
| 3,500,532 A | 3/1970 | Lozano |
| 5,703,436 A | 12/1997 | Forrest et al. |
| 5,707,745 A | 1/1998 | Forrest et al. |
| 5,998,803 A | 12/1999 | Forrest et al. |
| 6,294,398 B1 | 9/2001 | Forest et al. |
| 6,407,408 B1 | 6/2002 | Zhou et al. |
| 6,468,819 B1 | 10/2002 | Kim et al. |
| 8,222,072 B2 * | 7/2012 | Kim et al. ........... 438/99 |
| 2002/0127478 A1 | 9/2002 | Weaver et al. |
| 2002/1027478 | 9/2002 | Weaver et al. |
| 2002/0148113 A1 | 10/2002 | Forrest et al. |
| 2003/0006697 A1 | 1/2003 | Weaver |
| 2004/0121568 A1 | 6/2004 | Kim et al. |
| 2012/0295425 A1 * | 11/2012 | Kim et al. ......... 438/483 |

FOREIGN PATENT DOCUMENTS

| EP | 0 402 942 | 12/1990 |
| JP | 2002-203674 | 7/2002 |
| WO | WO 01/17319 | 3/2001 |
| WO | WO02/22372 | 3/2002 |

OTHER PUBLICATIONS

Y. Xia et al., Unconventional methods for fabricating and patterning nanostructures, *Chem. Rev.* 99, pp. 1823-1848 (1999).
Weaver et al., "Flexible Organic LED Displays," 2001 Soc. Vac. Coaters 505/856-7188, 44th Annual Technical Conf. Proc., Philadelphia, Apr. 21-26, 2001, ISSN 0737-5921, pp. 155-159.

(Continued)

*Primary Examiner* — Jack Chen
(74) *Attorney, Agent, or Firm* — Morgan, Lewis & Bockius LLP

(57) ABSTRACT

Methods of transferring a metal and/or organic layer from a patterned stamp, preferably a soft, elastomeric stamp, to a substrate are provided. The patterned metal or organic layer may be used for example, in a wide range of electronic devices. The present methods are particularly suitable for nanoscale patterning of organic electronic components.

7 Claims, 16 Drawing Sheets

(56) References Cited

OTHER PUBLICATIONS

C. Kim et al., "Micropatterning of Organic Electronic Devices by Cold-Welding", *Science*, vol. 288, pp. 831-833, May 5, 2000.

C. Kim et al., "Nanolithography based on patterned metal transfer and its application to organic electronic devices", *Appl. Phys. Lett.* (2002), vol. 80, No. 21 4051, pp. 4051-4053, May 27, 2002.

U.S. Appl. No. 10/288,785, filed Nov. 6, 2002, entitled "Organic Light Emitting Materials and Devices".

M.A. Baldo, et al., "Very high-efficiency green organic light-emitting devices based on electrophosphorescence", Applied Physics Letters, vol. 75, No. 1, pp. 4-6, Jul. 5, 1999.

P.E. Burrows, et al. "Relationship between electroluminescence and current transport in organic heterojunction light-emitting devices", *Journal of Applied Physics*. May 15, 1996. vol. 79, No. 10, pp. 7991-8006.

H. Schmid et al., "Siloxane Polymers for High-Resolution, High-Accuracy Soft Lithography", *Macromolecules* (2000), vol. 33, No. 8, pp. 3042-3049, Apr. 18, 2000.

T.W. Odom et al., "Improved pattern transfer in soft lithography using composite stamps", *Langmuir* (2002), vol. 18, No. 13, pp. 5314-5320, Jun. 25, 2002.

A. Kumar, et al., "Features of gold having micrometer to centimeter dimensions can be formed through a combination of stamping with an elastomeric stamp and an alkanethiol "ink" followed by chemical etching", *Appl. Phys. Lett.* 63, (14), pp. 2002-2004 (Oct. 4, 1993).

A. Bernard, et al., "Microcontact Printing of Proteins", *Adv. Mater.* 2000, 12, No. 14, pp. 1067-1070 (Jul. 19, 2000).

J. Bharathan, et al., "Polymer electroluminescent devices processed by inkjet printing: I. Polymer light-emitting logo", *Appl. Phys. Lett.* vol. 72, No. 21, pp. 2660-2662 (May 25, 1998).

E. Delamarche, et al., "Patterned Delivery of Immunoglobulins to Surfaces Using Microfluidic Networks", *Science* vol. 276, pp. 779-781 (May 2, 1997).

D. C. Duffy, et al., Rapid Prototyping of Microfluidic Systems in Poly(dimethylsiloxane), *Anal. Chem. 1998*, 70, pp. 4974-4984 (Dec. 1, 1998).

T. R. Hebner, et al., "Ink-jet printing of doped polymers for organic light emitting devices", *Appl. Phys. Lett.* vol. 72, No. 5, pp. 519-521 (Feb. 2, 1998).

L. Libioulle, et al., "Contact-Inking Stamps for Microcontact Printing of Alkanethiols on Gold", *Langmuir* 1999, vol. 15, No. 2, pp. 300-304.

Y. Xia, et al., "Soft Lithography", *Angew Chem. Int. Edit.* 1998, 37, pp. 550-575 (1998).

B. Michel, et al., "Printing meets lithography: Soft approaches to high-resolution patterning", *IBM J. Res. & Dev.* vol. 45, No. 5, pp. 697-719 (Sep. 5, 2001).

M. Geissler, et al., "Microcontact-Printing Chemical Patterns with Flat Stamps", *J. Am. Chem. Soc. 2000*, 122, pp. 6303-6304.

L. S. Hung, et al., "Electrode modification and interface engineering in organic light-emitting diodes", *Mat. Sci. Eng. B-SOLID* 85, pp. 104-108 (2001).

H. O. Jacobs, et al., "Submicrometer Patterning of Charge in Thin-Film Electrets", *Science* vol. 291, pp. 1763-1766 (Mar. 2, 2001).

G. S. Ferguson, et al., "Contact Adhesion of Thin Gold Films on Elastomeric Supports: Cold Welding Under Ambient Conditions", *Science*, vol. 253, No. 5021, pp. 776-778 (Aug. 16, 1991).

Y.-L. Loo, et al., "Additive, nanoscale patterning of metal films with a stamp and a surface chemistry mediated transfer process: Applications in plastic electronics", *Appl. Phys. Lett.* vol. 81, No. 3, pp. 562-564 (Jul. 15, 2002).

Y.-L. Loo, et al., "Interfacial Chemistries for Nanoscale Transfer Printing", *J. Am. Chem. Soc. 2002*, 124, pp. 7654-7655.

C. W. Tang, et al., "Organic Electroluminescent Diodes", *Appl. Phys. Lett.* 51, (12), pp. 913-915 (Sep. 21, 1987).

L. S. Hung, et al., "Enhanced electron injection in organic electroluminescence devices using an Al/LiF electrode", *Appl. Phys. Lett.* 70, (2), pp. 152-154 (Jan. 13, 1997).

J. A. Rogers, "Printing Process Suitable for Reel-to-Reel Production of High-Performance Organic Transistors and Circuits", *Adv. Mater. 1999*, 11, No. 9, pp. 741-745.

David C. Duffy et al., "Patterning Electroluminescent Materials with Feature Sizes as Small as 5 μm Using Elastomeric Membranes as Masks for Dry Lift-Off," Adv. Mater., vol. 11, No. 7 (1999) pp. 546-552.

T. R. Ilebner, et al., "Ink jet printing of doped polymers for organic light emitting devices", *Appl. Phys. Lett.* vol. 72, No. 5, pp. 519-521 (Feb. 2, 1998).

Y. Xia, et al., "Soft Lithography", *Angew. Chem. Int. Edit.* 1998, 37, pp. 550-575 (1998).

L. S. Hung, et al., "Enhanced electron injection in organic electroluminescence devices using an Al/LiF electrode", *Appl. Phys. Lett.* 70, (2), pp. 152-154 (Jan. 13, 1997).

PCT International Search Report for PCT/US03/38276 mailed on Sep. 16, 2004.

PCT International Search Report for PCT/US05/036130 mailed on Feb. 28, 2007.

Granlund et al., 2000, "Patterning of Polymer Light-Emitting Diodes with Soft Lithography", Advanced Materials, 12(4):269-273.

Zaumseil a., 2003, "Contact resistance in organic transistors that use source and drain electrodes formed by soft contact lamination", J. Of Appl. Phys. 93(10):6117-6124.

Schmid et al., 2003, "Preparation ofMetallic Films on Elastomeric Stamps and Their Application for Contact Processing and Contact Printing", Advanced Functional Materials 13(2):145-153.

Kim et al., 2005, "Patterning of active organic materials by direct transfer for organic electronic devices", 97(11):113512-113512.

Folch et al., 1999, "Wafer-Level In-Registry Microstamping", IEEE Journal of Microelectromechanical Systems, 8(1)85-89.

\* cited by examiner (a)
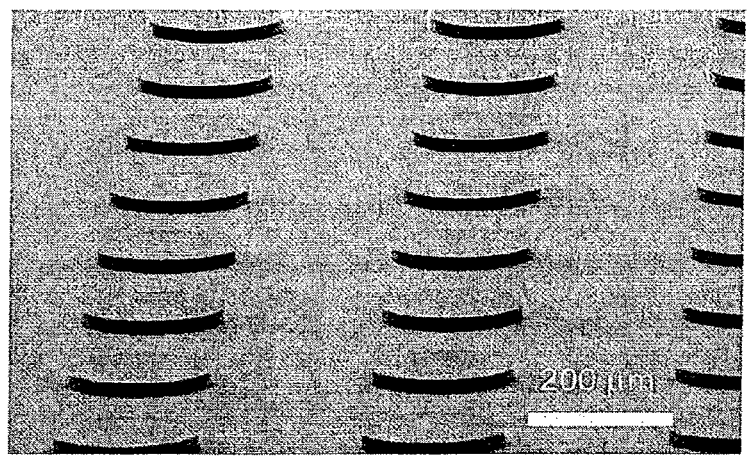
(b)
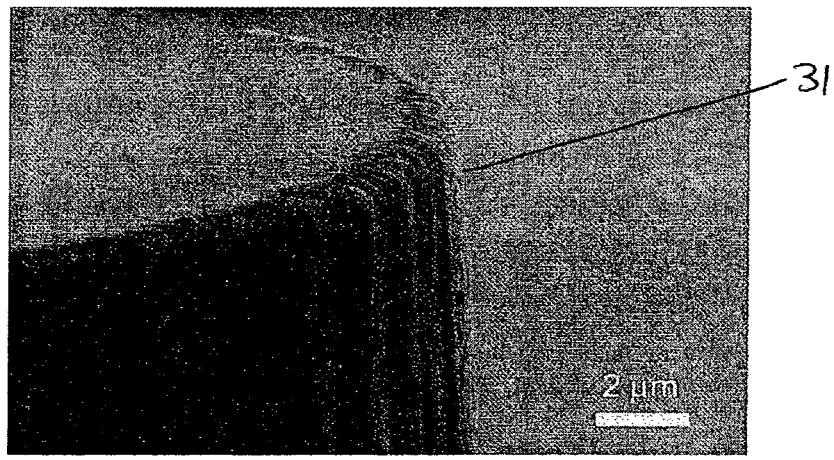
(c)
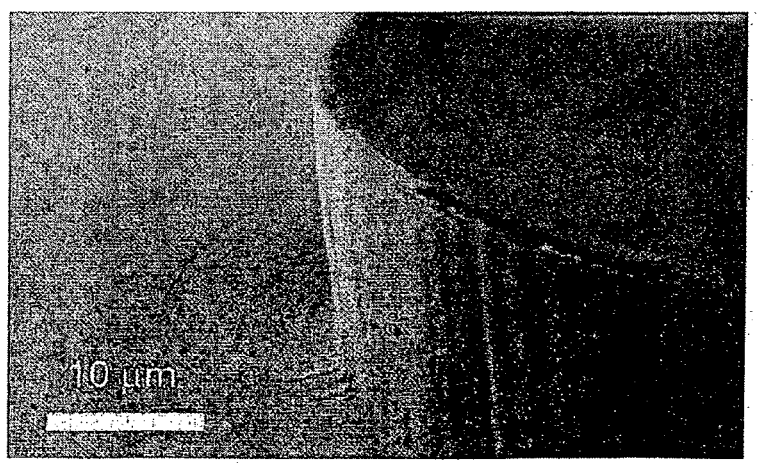
Fig 3

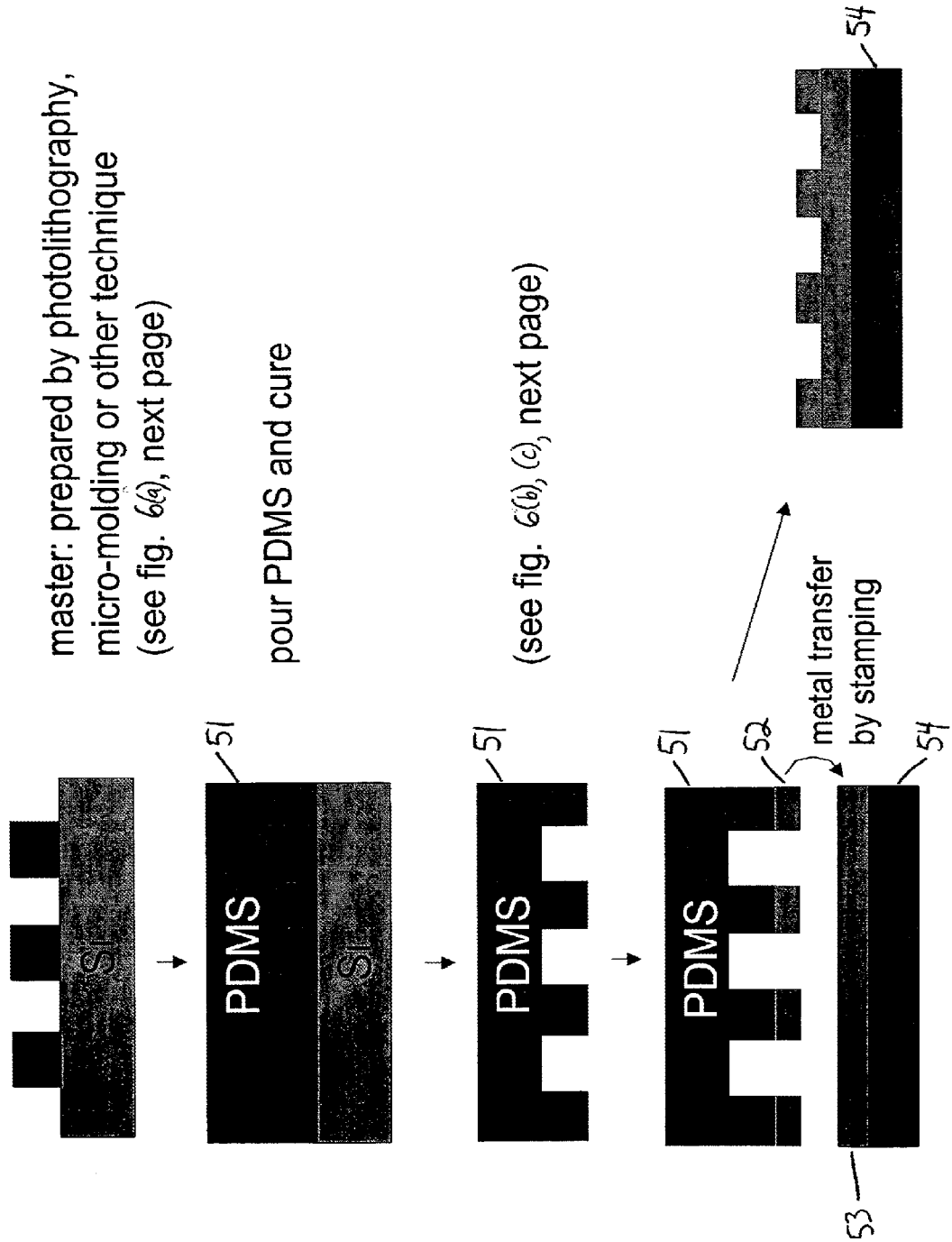

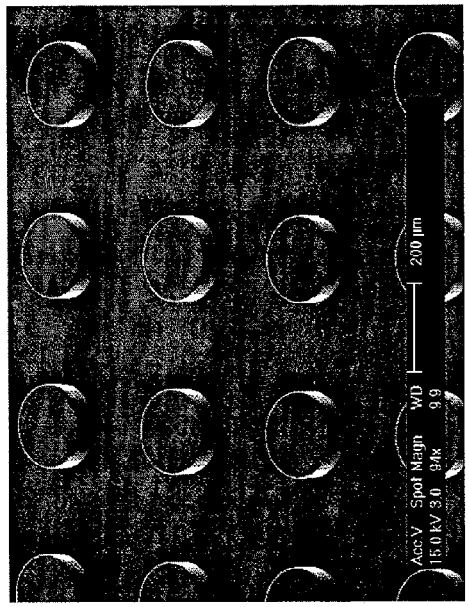
Fig. 6(b): PDMS stamp
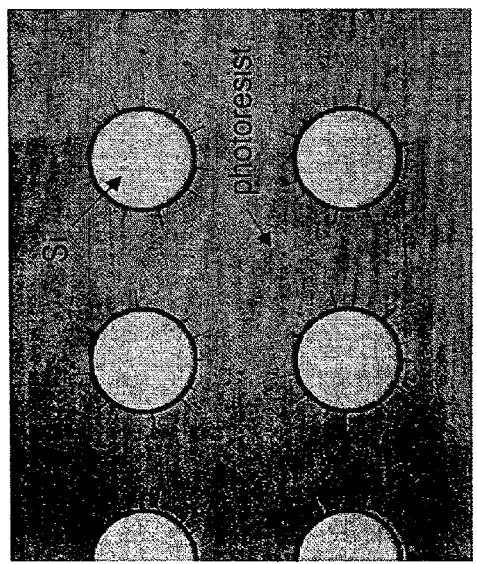
Fig. 6(a): master
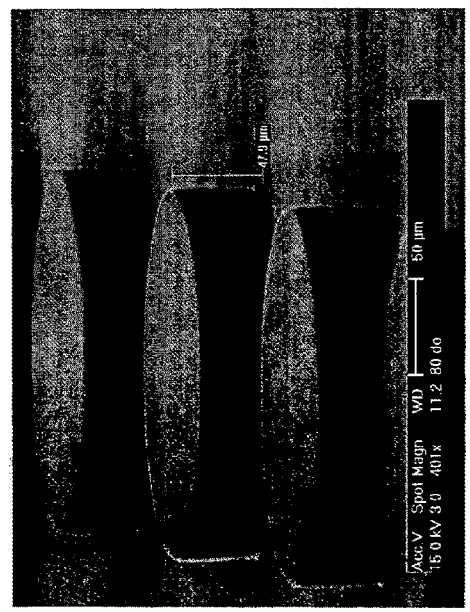
Fig. 6(c): PDMS stamp (a)
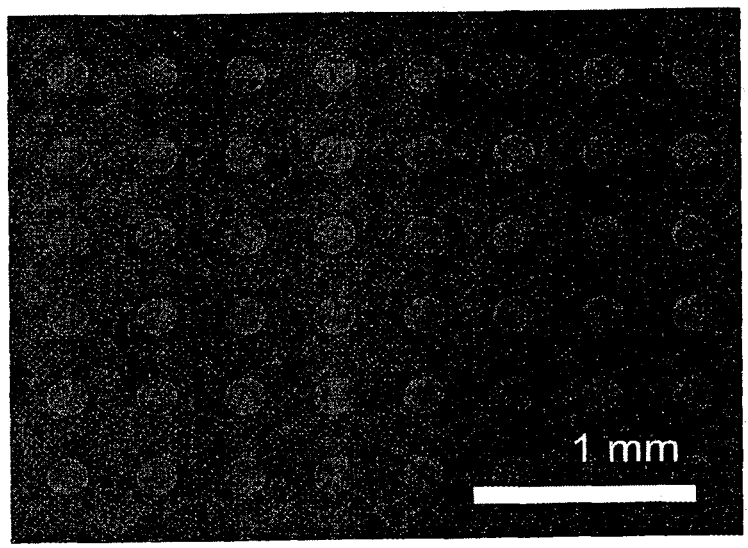
(b)
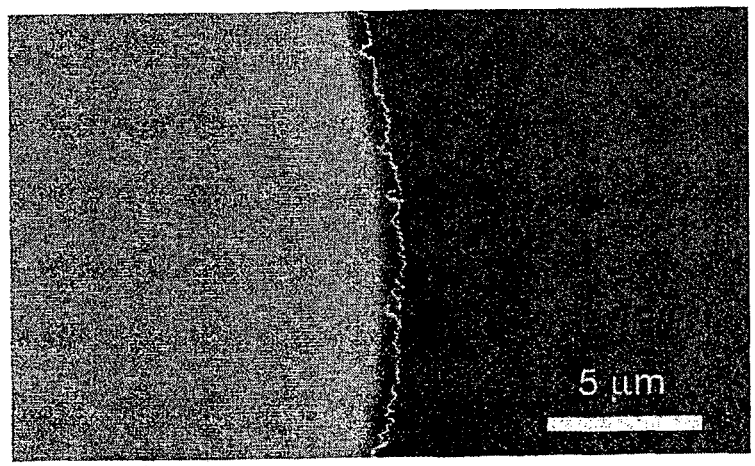
Fig 13

METHODS OF FABRICATING DEVICES BY LOW PRESSURE COLD WELDING

This application is a divisional of U.S. application Ser. No. 10/387,925, filed Mar. 13, 2003, now U.S. Pat. No. 8,222,072 which claims the benefit of U.S. Provisional Application No. 60/435,350, filed Dec. 20, 2002, which is incorporated herein by reference in its entirety. The subject matter of this application is related to U.S. Pat. Nos. 6,468,819, 6,407,408, patent application Ser. No. 09/802,977, now U.S. Pat. No. 6,596,443; Ser. No. 09/833,695, now U.S. Pat. No. 6,895,667; Ser. No. 09/899,850, now U.S. Pat. No. 6,664,730; all of which are incorporated herein by reference in their entireties.

JOINT RESEARCH AGREEMENT

The claimed inventions were made by, on behalf of, and/or in connection with one or more of the following parties to a joint university corporation research agreement: Princeton University, The University of Southern California, and the Universal Display Corporation. The agreement was in effect on and before the date the claimed inventions were made, and the claimed inventions were made as a result of activities undertaken within the scope of the agreement.

FIELD OF THE INVENTION

The present invention relates to a method of fabricating a device, and more particularly to the transfer of a metal or organic layer from a patterned stamp to a substrate.

BACKGROUND OF THE INVENTION

Nearly all electronic and optical devices require patterning. Patterned metals are used in forming a variety of such devices. For example, patterned metals may be used in forming transistors, as electrodes in various devices, and as shadow masks in the patterning of various materials. One possible use for patterned metals is as electrodes in organic light emitting devices (OLEDs), which make use of thin films that emit light when excited by electric current. Popular OLED configurations include double heterostructure, single heterostructure, and single layer, and may be stacked, as described in U.S. Pat. No. 5,707,745, which is incorporated herein by reference in its entirety.

Patterning of sub-micrometer structures is preferable for the realization of new and improved types of devices such as flat panel displays.

For OLEDs from which the light emission is only out of the bottom of the device, that is, only through the substrate side of the device, a transparent anode material such as indium tin oxide (ITO) may be used as the bottom electrode. Since the top electrode of such a device does not need to be transparent, such a top electrode, which is typically a cathode, may be comprised of a thick and reflective metal layer having a high electrical conductivity. In contrast, for transparent or top-emitting OLEDs, a transparent cathode such as disclosed in U.S. Pat. Nos. 5,703,436 and 5,707,745 may be used. As distinct from a transparent or bottom-emitting OLED, a top-emitting OLED is one which may have an opaque and/or reflective substrate, such that light is produced only out of the top of the device and not through the substrate, or can be a fully transparent OLED that may emit from both the top and the bottom.

As used herein, the term "organic material" includes polymers as well as small molecule materials that may be used to fabricate OLEDs. The organic materials of an OLED are very sensitive, and may be damaged by conventional semiconductor processing. For example, any exposure to high temperature or chemical processing may damage the organic layers and adversely affect device reliability.

SUMMARY OF THE INVENTION

An embodiment of the invention is directed to a method of fabricating a device by depositing a metal layer over a patterned stamp, and then transferring the metal layer from the patterned stamp onto a substrate. Preferably, the patterned stamp is a soft, elastomeric stamp.

An embodiment of the invention is also directed to a method of fabricating a device by depositing one or more organic layers over a patterned stamp, and then transferring the organic layer(s) from the patterned stamp onto a substrate. Preferably, the patterned stamp is a soft, elastomeric stamp. A combination of metal and organic layers may also be transferred from a patterned stamp onto a substrate.

An embodiment of the invention includes transferring a deposited metal layer from a patterned stamp onto a substrate by cold-welding. According to this embodiment, a strike layer is optionally deposited over a substrate and a patterned stamp is obtained having a metal layer deposited over the stamp. The stamp is then pressed onto the substrate, such that the metal layer over the patterned stamp contacts portions of the strike layer or other underlying layer, and sufficient pressure is applied to cold-weld the metal layer to the strike layer or other underlying layer. The patterned stamp is removed and the portions of the metal layer that are cold-welded to the strike layer or the substrate break away from the stamp and remain cold-welded to the strike layer or the substrate, in substantially the same pattern as the patterned stamp.

Another embodiment of the invention includes transferring a deposited organic layer from a patterned stamp onto a substrate by "cold-welding". According to this embodiment, a strike layer is optionally deposited over a substrate and a patterned stamp is obtained having an organic layer deposited over the stamp. The stamp is then pressed onto the substrate, such that the organic layer over the patterned stamp contacts portions of the strike layer or the substrate, and sufficient pressure is applied to "cold-weld" the organic layer to the strike layer or the substrate. The patterned stamp is removed and the portions of the organic layer that are "cold-welded" to the strike layer or the substrate break away from the stamp and remain adhered to the strike layer or the substrate, in substantially the same pattern as the patterned stamp.

BRIEF DESCRIPTION OF THE DRAWINGS

FIG. 3 shows scanning electron microscope (SEM) images of a stamp before (a, b) and after (c) the metal pattern is transferred.

FIG. 5 depicts the formation of a PDMS stamp and a method according to an embodiment of the present invention of using that stamp to transfer metal to a substrate.

FIG. 6(a) shows a top view of a master, and FIGS. 6(b) and 6(c) show SEM images of the PDMS stamp fabricated from the master shown in FIG. 6(a).

FIG. 13 shows optical microscope images of cathodes fabricated in accordance with embodiments of the invention.

DETAILED DESCRIPTION

Figure 1:
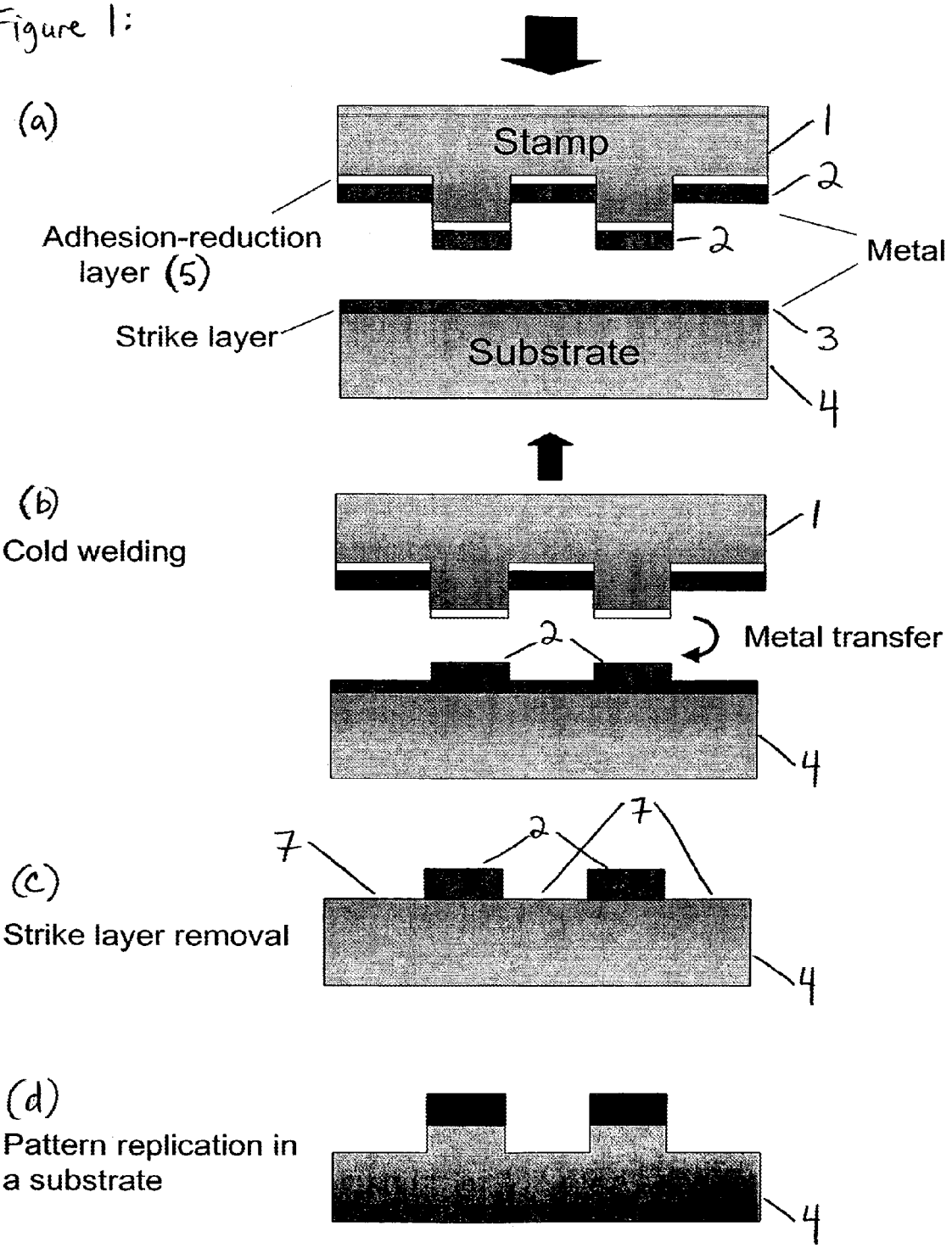
FIG. 1 is a schematic illustration of the patterned metal transfer process according to an embodiment of the present invention.

The present invention will be described with reference to the illustrative embodiments in the following processes and drawing figures.

Methods are provided for forming a patterned metal and/or organic layer over a substrate using a stamp. Such a patterned metal or organic layer may be used for example, in forming an electronic device, either as part of the device itself or as a mask in patterning other layers of the device or the substrate.

In one embodiment of the invention, a method is provided for forming a patterned metal layer over a substrate using a stamp. This embodiment may be used to produce features of submicron scale based on the transfer of a metal layer from a stamp to a substrate assisted by the atomic scale process of metallic cold welding. The patterned metal layer can be used for example, as an etch mask to replicate the pattern on the substrate, or the layer itself can serve as contact electrodes for a wide range of electronic devices. Given the very high pattern resolution and its compatibility with organic electronics, this technique holds promise for application to the formation of contacts to devices at the single molecule scale.

Cold welding is the formation of a metallic bond at about room temperature between two metal surfaces by application of pressure. Preferably, the two metal surfaces are of like composition. Cold welding is used to bond separate metal parts of macroscopic size. The surfaces bond to each other when the interfacial separation is decreased below a critical value, resulting in a single solid. In order to achieve good patterns by this technique, the applied pressure should be high enough to decrease the interfacial separation below the critical value. That is, the applied pressure should be high enough to decrease the interfacial separation of the thin metal film and metal layers below the critical value. The present methods preferably use cold welding for transferring any desired metal layer from a patterned, soft elastomeric stamp to a substrate; although other bonding methods known to those in the art are contemplated and within the scope of the invention.

In another embodiment of the invention, a method is provided for forming a patterned organic layer over a substrate using a stamp. Although not wishing to be bound by any particular theory, it is believed that in this embodiment of the invention, organic-to-organic van der Waals forces are the mechanism for bonding one organic layer to another organic layer. That is, in this embodiment, instead of a metal layer in contact with a metal layer, an organic layer is in contact with an organic layer with sufficient pressure such that the two organic layers are bound together. For example, van der Waals forces may be responsible for such bonding. The term "cold-welding" is used herein to also refer to this organic-to-organic bonding, even though the term "welding" is typically used only in connection with metal-to-metal bonding.

As the transferred organic layer may comprise an active component of a device, this embodiment of the method of the invention can be used to fabricate, for example, organic integrated circuits such as organic active matrix displays. When incorporated into roll-to-roll processes, these methods are very suitable for high-throughput and cost-effective fabrication of organic electronic devices. Although many of the embodiments described herein include the transferring of a metal layer, it should be understood that the metal layers therein could be replaced by organic layers, and thus the metal-layer-transferring embodiments of the invention should also be viewed as illustrative of possible organic-layer-transferring embodiments of the invention.

The methods of the present invention are particularly suitable for nanoscale patterning of organic electronic components, where the wet processes used in conventional photolithography might damage underlying organic materials.

Patterning techniques based on stamps or molds provide practical advantages, and they are in principle free from the limitations of optical diffraction. The present cold welding technique has the advantages of both simplicity and high resolution common to other methods based on stamping or molding. In contrast to other techniques, however, it is well suited for direct patterning of organic electronic, or at the highest pattern resolutions, molecular electronic devices. For example, previously described techniques use polymer films heated to temperatures higher than their glass transition temperatures, while others involve wet chemicals, both features being incompatible with many fragile molecular solids.

U.S. Pat. No. 6,468,819, which is incorporated herein by reference, describes direct patterning of organic electronic devices using cold welding followed by lift-off of cathode metals on selected regions of an organic semiconductor thin film. Thus, a patterned metal film deposited onto the surface of the organic layers was obtained by a subtractive process, whereby metal on unwanted areas was removed when the stamp was separated from the substrate.

Furthermore, the present additive methods allow for the fabrication of such organic electronic devices as organic thin film transistors (OTFTs) where damage inflicted by application of excessive pressure to the active device regions should be avoided. Indeed, the range of applications of the additive process is not confined to organic electronics: this method may also find uses wherever ultrahigh resolution metal patterns are required, such as in adding low resistance metal bus lines to passive matrix displays and memories. As a result, the methods of the invention are well suited for roll-to-roll processing of organic integrated circuits where contacts for various components such as OTFTs, organic light-emitting diodes (OLEDs), solar cells, and photodetectors must be simultaneously patterned.

Figure 15:
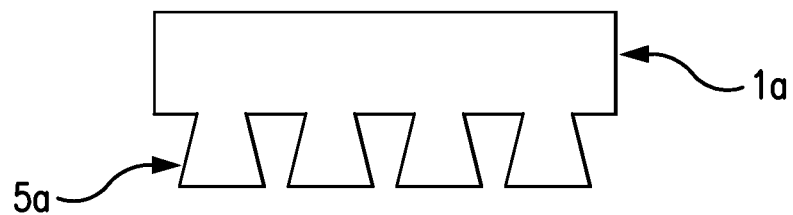
FIG. 15 shows a preferred shape for the stamp of an embodiment of the present invention to avoid side wall deposition of metal on the stamp.

In an embodiment of the invention, prior to transferring the metal layer, a metal layer is deposited over a patterned stamp having at least one raised portion such that the metal layer is deposited at least over the raised portions of the stamp. The stamp is patterned in that it has raised and depressed portions that form a desired pattern. The stamp may be patterned by any method known in the art, such as by lithography and reactive ion etching. The stamp preferably has sharp edges to avoid side wall deposition of metal on the stamp. Additionally, the shape of the stamp may help avoid side wall deposition of a metal on the stamp. A preferred shape for the stamp is depicted in FIG. 15.

Preferably, the stamp is made of a substance that is readily patterned or easily fabricated from a mold. Examples of suitable materials that may be used to form stamps in accordance with embodiments of the present invention include soft substances such as poly(dimethylsiloxane) ("PDMS"), hard substances such as silicon, glass, quartz, steel and hard metals, as well as other materials known to those skilled in the art, and combinations thereof.

In a particularly preferred embodiment of the present invention, the stamp is compliant and is made of a soft, elastomeric material. A non-limiting example of a suitable soft, elastomeric material for the stamp is PDMS. In addition, other soft, elastomeric materials known to those of skill in the art may be used to form stamps in accordance with the present invention. Examples of such suitable materials include polyurethane and optical adhesives, such as those available from Norland Products Inc., of Cranbury, N.J. A representative example of a Norland Optical Adhesive (NOA) is NOA 73. As used herein, the term "soft," when describing a stamp or its material, is a relative term which denotes a stamp or material that can more easily deform around substrate features (including particles) than can a rigid stamp. Thus, the softness of a stamp is dependent upon substrate features. For example, for most PDMS, a suitable material for a soft stamp, the value of E (Young's modulus) is within the range of about 0.1 to about 10 MPa, and the value of G(shear modulus) is less than or equal to about 1 MPa. On the other hand, for silicon, a suitable material for a rigid stamp, the value of E (Young's modulus) is equal to about 130 GPa, and the value of G(shear modulus) is equal to about 30 GPa. These values for E and G for a soft and rigid stamp are only representative values, and they do not establish nor limit suitable ranges for values of E and G for a soft and rigid stamp.

When a soft, elastomeric stamp is used in embodiments of the method of the present invention, the force to be applied across the stamp can be more easily applied uniformly such that a lower applied force is needed to form a cold-welded bond, as compared to those methods employing a rigid stamp. Furthermore, a soft, elastomeric stamp can more easily deform around substrate features (including particles) than can a rigid stamp. Thus, patterned metal or organic transfer can be achieved at much lower pressures when using a soft, elastomeric stamp, allowing for the application of pressure directly over a device active region with far less likelihood of introducing damage thereto. In addition, the applied force needed to form a cold-welded bond depends on the roughness of the surfaces to be bonded, with rougher surfaces generally requiring a higher applied force.

Figure 16:
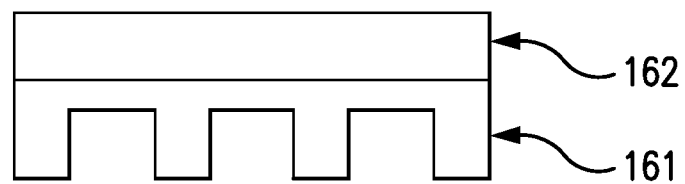
FIG. 16 shows an embodiment of a hybrid stamp adapted for use with an embodiment of the present invention.

Additionally, the stamp may be a hybrid stamp, as is shown in FIG. 16. In the embodiment of a hybrid stamp as shown in FIG. 16, the pattern shape is formed in an outer layer 161 of a stiffer material, while a softer inner layer 162 provides conformability.

Patterning may be achieved by methods known in the art based on the composition of the stamp. For example, PDMS stamps can be fabricated using a method used in 'soft lithography,' as described in Y. Xia et al., *Unconventional methods for fabricating and patterning nanostructures*, Chem. Rev. 99, 1823-1848 (1999). FIG. 5 depicts the formation of a PDMS stamp using a silicon master, as described by Xia et al. After the stamp is formed, the metal to be transferred is then deposited over the molded stamp. One example of a suitable patterning technique when the stamp is made of silicon is lithography using a phase mask and reactive ion etching.

In a further embodiment of the method of the present invention, prior to transferring the metal layer onto the substrate, a strike layer is deposited onto the substrate, such that the metal layer from the stamp is transferred onto the strike layer. The strike layer can be deposited using deposition techniques which are known in the art. The strike layer serves to facilitate the transfer of the metal layer from the stamp to the substrate, and helps to provide a good electrical contact for the transferred metal layer. Preferably, the strike layer is deposited as a blanket layer such that patterning is provided by the transferred metal layer. Examples of suitable materials which may be used as the strike layer include, but are not limited to, metals and organic materials. For example, when using an embodiment of the method of the present invention to fabricate an OLED, the strike layer can include a layer of Al and LiF, adjacent to a layer of Au.

The metal layer over the stamp preferably includes a metal that is capable of cold-welding to a strike layer, such as a thin metal film, over the substrate upon compression of the metal layer to the thin metal film.

Substrates in accordance with embodiments of the present invention may be made of any suitable material, including for example, glass, polymers, silicon and plexiglass. The substrate may be rigid, non-rigid, flexible, opaque or transparent. Of the materials that are presently commercially available, preferred flexible substrates include polyethylene terephthalate (PET), poly-ethersulphone (PES), polycarbonate (PC), polyethylenenaphthalate (PEN) and polyimide (PI). Each of these materials has advantages and disadvantages that are more fully described in Weaver et al., "Flexible Organic LED Displays," 2001 Soc. Vac. Coaters 505/856-7188, 44th Annual Technical Conf. Proc. (2001) ISSN 0737-5921 ("Weaver et al."), which is incorporated by reference in its entirety. It is expected that chemical companies will develop new materials that are better suited for use as a flexible substrate for the fabrication of OLED displays. It is also expected that various embodiments of the present invention may be practiced with such substrates when they become available.

Suitable metals for use as the metal layer and the strike layer preferably include those known to those skilled in the art as being capable of cold-welding to one another. Preferably, the metal layer and the strike layer are made of non-reactive metals, such as silver and gold that do not form an oxide layer, or the method of the invention is carried out in vacuum to prevent the formation of an oxide layer. The metal layer and the strike layer may be made of the same metal or different metals and preferably form a strong cold-welded bond with one another when pressure is applied. For example, if the metal layer is made of gold, the strike layer may be made of gold or silver; and if the metal layer is made of silver, the strike layer may be made of gold or silver. Other combinations may also be used.

According to an embodiment of the present invention, in FIG. 1(a), a patterned stamp 1 coated with a metal layer 2 is pressed onto a substrate 4 pre-coated with a very thin (~10 nm) metal strike layer 3. Cold welding between the two contacting metal layers then occurs when enough pressure is applied to overcome the potential barrier existing at the surfaces due to oxidation or surface contamination. Upon separation of the stamp 1 from the substrate 4, the metal layer 2 of the contacted area on the stamp is transferred to the substrate 4 (FIG. 1(b)). Next, the metal strike layer 3 on the substrate is anisotropically etched to remove the residual strike layer, thereby exposing the substrate materials in regions 7 between the stamped pattern (FIG. 1(c)). Using the metal layer left behind as an etch mask, the pattern can be further transferred to the substrate 4 (FIG. 1(d)) by various etching methods, for example reactive ion etching (RIE). In addition, the patterned metal layer 2 in FIG. 1(c) can be used as electrodes if the substrate contains pre-deposited semiconductor layers necessary to form the desired electronic devices or as bus lines.

According to another embodiment of the invention, more than one metal layer may be coated on the patterned stamp and then transferred to the substrate via cold-welding. For example, more than one metal layer may be transferred to the substrate to form a compound cathode, such as a Mg:Ag/ITO compound cathode.

Figure 2:
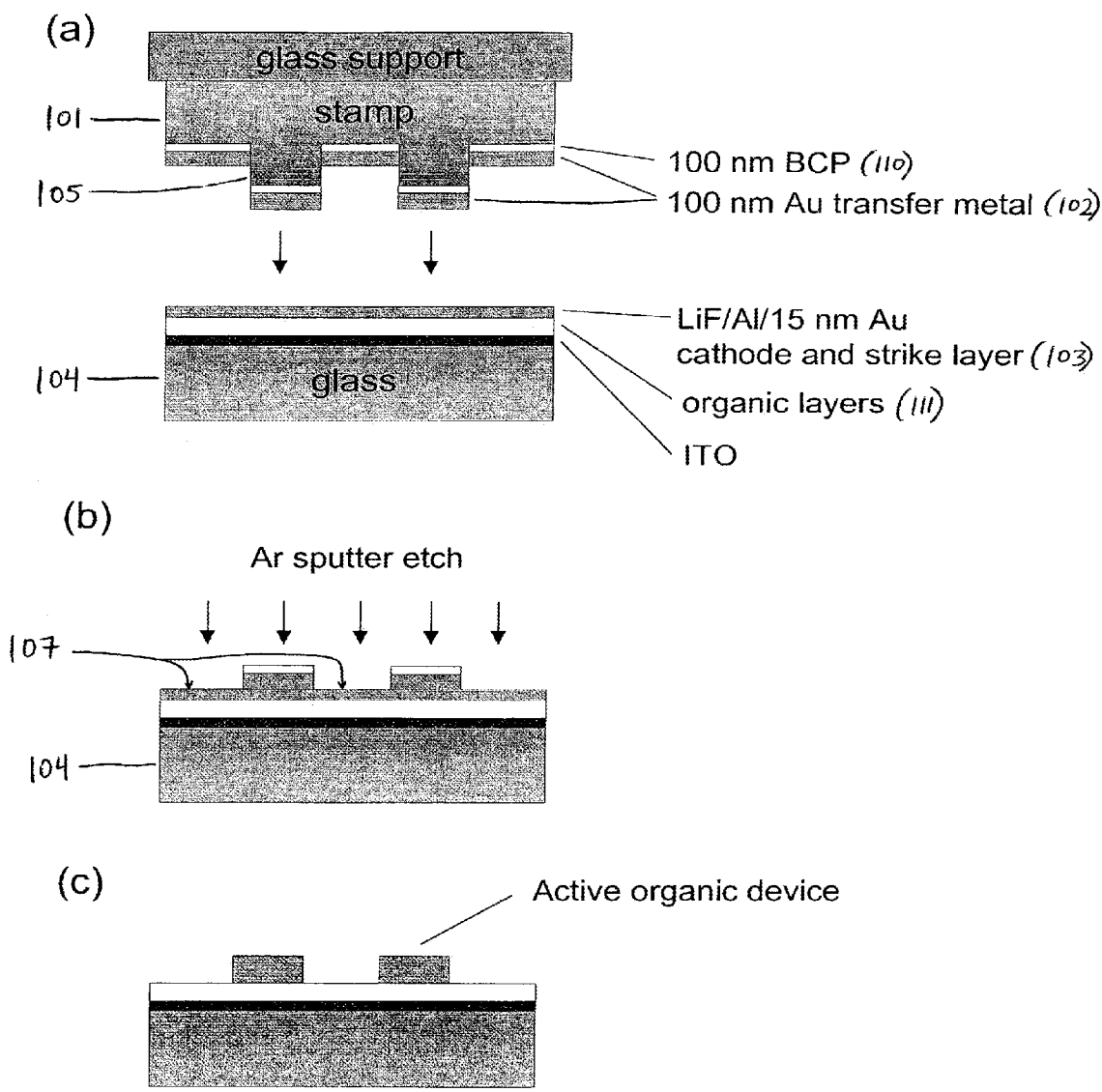
FIG. 2 shows the cathode patterning of organic electronic devices by low pressure cold welding.

The embodiment of the invention depicted in FIG. 2 shows cathode patterning of organic electronic devices by low pressure cold welding. In FIG. 2(a), the elastomeric stamp 101 made of poly(dimethylsiloxane) (PDMS) precoated with a thick metal (Au) layer 102 is pressed onto the substrate 104 coated with the organic heterostructure of organic layers 111 and the cathode 103, which also acts as a thin metal strike layer 103. In FIG. 2(b), upon separation of the stamp 101 from the substrate 104, the metal film 102 on the stamp 101 cold-welded with that on the substrate 104 remains on the substrate 104. In FIG. 2(c), the strike layer 103 is removed by Ar sputter etching to electrically isolate the contacts.

FIG. 3 shows scanning electron microscope (SEM) images of a stamp both before (FIGS. 3(a) and (b)) and after (FIG. 3(c)) the metal pattern is transferred in accordance with an embodiment of the method of the invention. The stamp has a pattern of an array of 200-μm-diameter posts, as seen in FIG. 3(a). The grooves 31 on the sidewall and rounded edge (FIG. 3(b)) are due to the photoresist mold. During the metal transfer, the Au film is irregularly transferred from the rounded stamp edge (FIG. 3(c)), limiting the edge resolution (as seen in FIG. 13).

Figure 4:
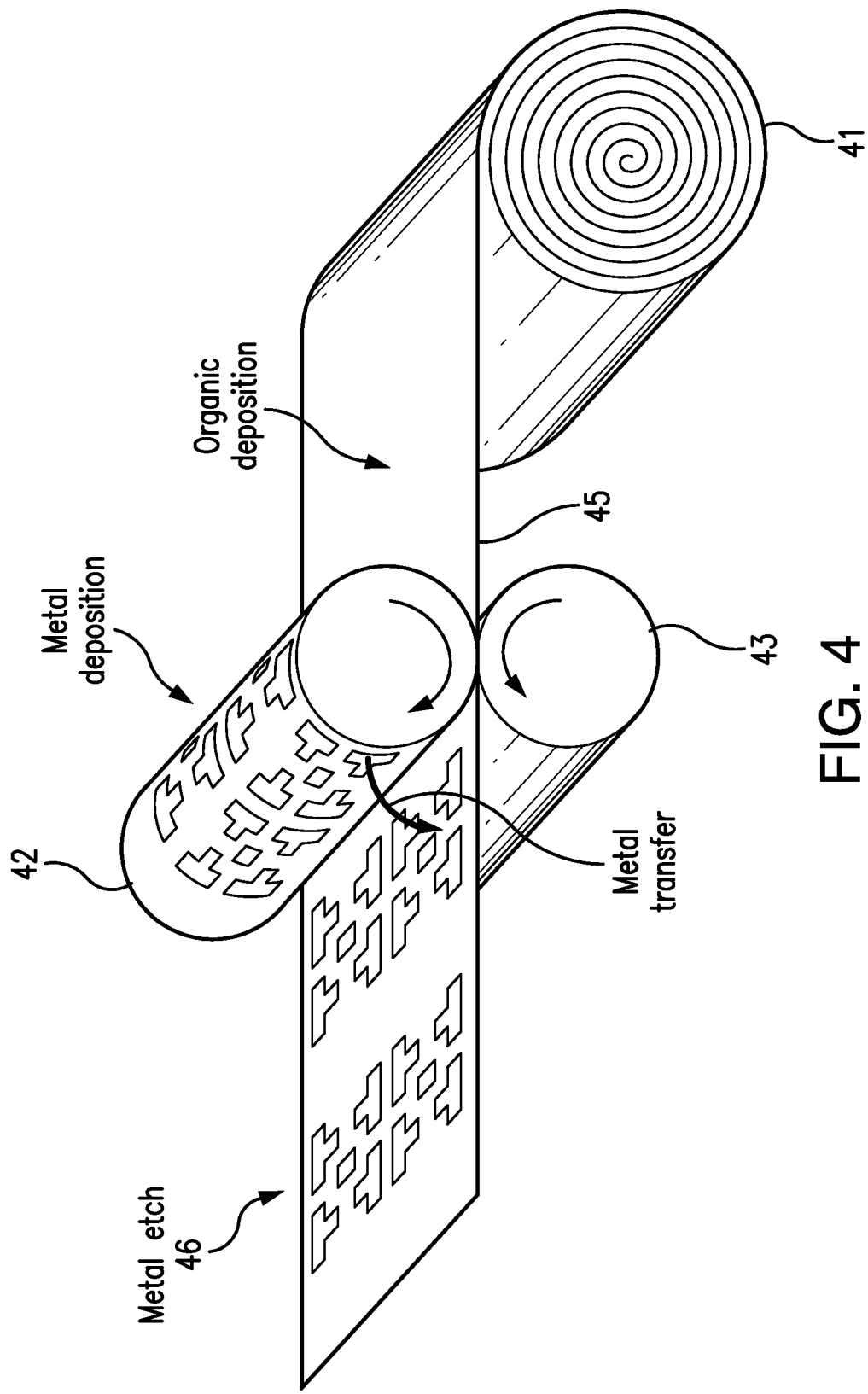
FIG. 4 depicts an example of a roll-to-roll process for the fabrication of organic electronic integrated circuits, into which process the present methods may be incorporated.

FIG. 4 depicts an example of a roll-to-roll process for the fabrication of organic electronic integrated circuits, into which process the present methods may be incorporated. A sheet of plastic substrate 41 is rolled out, and translated by cylindrical drums 42, 43. The upper drum 42 has a desired electrode pattern on its surface and is coated with an adhesion-reduction layer. First, organic layers are deposited, for example, by organic vapor phase deposition (OVPD) onto the substrate 41, followed by deposition of the thin metal strike layer 45. As the substrate 41 is pressed between the drums 42, 43, the metal film on the drum is transferred to the substrate 41 by cold welding. Next, the electrode pattern on the substrate is obtained by a brief metal etch 46 to remove the strike layer 45. Metal deposition on one side of the drum allows for a continuous process.

Electrodes deposited by embodiments of the methods of the invention may include any material known to those skilled in the art. Preferably, the electrodes are substantially transparent, that is, they are made of the appropriate materials for achieving transparency, and are fabricated to the appropriate thickness for achieving transparency. Electrodes of embodiments of the present invention are preferably fabricated from a conductive metal oxide. Preferred materials of electrodes according to the present invention, such as transparent electrodes, include for example indium tin oxide (ITO), MgAg, and aluminum. Preferred non-transparent electrode materials include LiF:Al. Conductive polymers such as polyaniline and poly (3, 4-ethylenedioxythiophene)/poly (styrenesulphoriate) (PEDOT/PSS) may also be used in accordance with the invention.

In addition, bus lines may also be deposited by embodiments of methods of the invention. These bus lines may be made of any suitable metal or other electrically conductive material, such as gold, silver, aluminum or copper, or any suitable alloy.

To avoid incomplete pattern transfer, adhesion between the stamp and the metal layer on it should be weaker than between any other interfaces present in the substrate, and compared to the fracture strength of the materials employed. Therefore, in a preferred embodiment of the invention, an adhesion-reduction layer 5 is inserted between the stamp 1 and the metal layer 2, as shown in FIG. 1(a). Likewise, when transferring an organic layer, it is preferable to insert an adhesion-reduction layer between the stamp and the organic layer in order to avoid incomplete pattern transfer. In cases where the transferred metal serves as a mask for further etching and pattern replication at the substrate, the metal on the stamp is preferably thicker than that on the substrate for good thickness contrast as shown in FIG. 1(b).

The metal additive process of an embodiment of the present invention differs from the prior subtractive technique in that it relies primarily on the cold welding process, while the subtractive method further requires fracture of the metal films. This difference gives the new additive technique several advantages described below, which make it practical for use in a roll-to-roll process for continuous patterning of organic electronic circuits, as depicted in FIG. 4.

A first advantage is that the present methods use lower pressures than prior methods. Cold welding may be achieved for example, between Au films at a remarkably lower pressure (about 180 kPa) using a soft, elastomeric stamp (see example 1 herein). That is, when a PDMS stamp is used for example, the pressure required for the additive patterning process is approximately 1000 times lower than what has been previously reported using a rigid stamp (see C. Kim et al., *Science* (2000), 288, 831; C. Kim et al., *Appl. Phys. Lett.* (2002), 80, 4051). Thus, this low pressure cold welding method may be particularly suitable for applications in which the applied pressure needs to be minimized. Embodiments of the invention in which soft, elastomeric stamps are used may optionally be applied to curved substrates and/or stamps.

However, for the subtractive process, a soft, elastomeric stamp is not desirable since the higher pressure may be needed to plastically deform the metal film at the pattern edges prior to its selective removal. With a soft, elastomeric stamp, this technique can also be applied to the fabrication of such vertical geometry devices as OLEDs and solar cells, where the active device areas are placed under direct pressure.

As shown in FIG. 5, when the PDMS stamp 51 is contacted with the substrate 54, the metal 52 is cold-welded to the substrate 54 or a material over the substrate (such as an optional metal strike layer 53), thereby transferring the patterned metal 52 from the stamp 51 to the substrate 54.

FIGS. 6(a), (b) and (c) show a master for a PDMS stamp, and the PDMS stamp which was fabricated from the master. Specifically, FIG. 6(a) shows a top view of a master. From the master shown in FIG. 6(a), a PDMS stamp is fabricated using a molding process. FIGS. 6(b) and 6(c) show SEM images of the PDMS stamp fabricated from the master shown in FIG. 6(a).

A second advantage of embodiments of the present invention results from the fact that the optimum pressure for the subtractive process increases with metal thickness, ultimately determining the maximum thickness of the patterned metal film practically achievable. However, for the present metal additive process, the optimum pressure is believed to be relatively thickness-independent.

A third advantage is that stamps of embodiments of the present invention are more readily reusable than stamps used in a subtractive process. For the subtractive process, the metal film lifted off from the substrate remains on the stamp, often resulting in the cleaning or removal of the metal film from the stamp after each pressing. On the other hand, in the case of the additive process, the metal layer can be re-deposited on the stamp without pre-cleaning, provided that the adhesion-reduction layer remains on the stamp, and that the thickness of accumulated metal layers in regions between the contact areas are smaller than the height of the pattern ridge. To this end, the pattern ridge is preferably of a sufficient height in relation to the thickness of the accumulated metal layers in regions between the contact areas. For example, with a pattern ridge height of about 100 μm and a deposited metal thickness on the stamp of about 0.1 μm, after about 1000 (100 μm/0.1 μm) metal depositions and stamp pressings, the regions between the contact areas on the stamp will be approximately filled up with the accumulated metal layers.

According to a further embodiment of the invention, no strike layer is needed in the method for the metal layer to transfer from the stamp to the substrate, and the metal layer may be transferred from the stamp to the substrate by bonding methods known to those skilled in the art other than cold welding. For example, the metal layer may be transferred directly to the substrate, or the metal layer may be transferred to an organic layer, or other material, which is coated on the substrate.

An embodiment of the present invention is further directed to metal and/or organic layers patterned over a substrate by the methods described herein, and to devices formed utilizing the methods described herein including, for example, OLEDs and arrays of OLEDs.

Organic materials, including small molecule organic materials, are optionally deposited over the substrate depending on the device being formed and the desired use of the patterned metal. For instance, if the patterned metal is to be used as an anode or a cathode in an organic light emitting device, organic materials will likely be deposited over the substrate at some point, either before or after a metal and/or organic layer is patterned over a substrate by the methods described herein.

The metal layer over the stamp may include two or more metal layers, so long as the layer furthest from the stamp is capable of adhering to the substrate or material thereover, preferably cold-welding to a strike layer, such as a thin metal film. Any additional metal layers over the stamp that do not come into contact with the substrate or material thereover need not be materials that are capable of cold-welding or otherwise adhering to the underlying material. Accordingly, metals such as chromium and aluminum may be used as one of two or more metal layers that make up the metal layer over a stamp, even though such metals may not be ideal candidates for cold welding.

Embodiments including at least two layers of metal over the stamp may be preferred for example, when the patterned metal layer over the stamp is being used as an etching mask, depending on the selectivity of an etching process. The additional metal layers may be advantageous when the patterned metal layer(s) is transferred to a substrate by the methods described herein, and layers under the patterned metal layer(s) are being etched, to prevent all of the patterned metal layer from being etched away prior to the completion of desired etching of any layers under the patterned metal layer(s). The etch rate depends on the material being etched and the process by which it is being etched. Therefore, it may be desirable to have as a second metal layer over a stamp (which is transferred to the substrate by embodiments of the method of the invention), a metal that has a slower etch rate than the first metal layer and/or the material that will be etched using the metal(s) as a mask.

In a further embodiment of the invention, after depositing a first metal layer over the stamp, additional organic and/or metal layers may be deposited onto the stamp over the first metal layer, depending on the particular device being fabricated, and all of these layers, or only some of these layers, may subsequently be transferred to the substrate. For example, one or more organic layers may be deposited over the first metal layer, and a second metal layer may be deposited over the one or more organic layers, and then the second metal layer, the one or more organic layers, and the first metal layer may then all be transferred from the stamp onto the substrate, or onto the optional strike layer or whatever material is over the substrate. In addition, one or more organic layers may be deposited over the first metal layer, and then the one or more organic layers and the first metal layer may then be transferred from the stamp onto the substrate, or onto the optional strike layer or whatever material is over the substrate. Furthermore, one or more organic layers may be deposited over the first metal layer, and then only the one or more organic layers (and not the first metal layer) may then be transferred from the stamp onto the substrate, or onto the optional strike layer or whatever material is over the substrate. Such embodiments of the invention could be used to fabricate, for example, an OLED.

The strike layer, such as for example, a thin metal layer, is deposited over the substrate by methods known in the art depending upon the material employed as the strike layer. For example, thermal evaporation is a form of deposition that may be suitable for depositing a thin layer of gold over the substrate. The preferred thickness of the strike layer varies depending upon, inter alia, the applications of the fabricated device, and the morphology of the layers of the device. For example, when a transferred metal is to be used as an electrode in an OLED, the strike layer preferably forms a continuous film, although a strike layer that only forms islands on the substrate (or whatever material is over the substrate) can also be employed. As a continuous film, the strike layer allows for a more uniform and consistent foundation upon which to cold-weld the transferred metal that is to be used as an electrode in an OLED. As a further example, when a transferred metal is to be used as an etch mask, a very thin strike layer, and even one that only forms islands on the substrate, is sufficient. Thus, exemplary strike layer thicknesses include, but are not limited to, those in the range of from about 5 nm to about 30 nm.

The metal layer deposited over the stamp is deposited by methods known in the art. For example, e-beam evaporation is an example of a form of deposition that may be suitable for depositing gold over the stamp. The preferred thickness of the metal layer deposited over the stamp varies depending upon, inter alia, the applications of the fabricated device, and the composition of the metal layer. Exemplary thicknesses of the metal layer deposited over the stamp include, but are not limited to, those in the range of from about 30 nm to about 100 nm. In embodiments of the method of the present invention, the stamp and the substrate are pressed (or "stamped") against one another such that the portions of the metal layer over the raised portions of the patterned stamp contact portions of the substrate, or the strike layer over the substrate. Sufficient pressure is applied to the stamp and/or the substrate, such that the portions of the metal layer that contact the substrate, or the strike layer over the substrate, cold-weld thereto.

When the stamp is applied to the substrate, or the strike layer over the substrate, the substrate may bend such that the device bows into depressed portions of the stamp. Contact between the device and the depressed portion of the stamp is undesirable, and could lead to contact between the substrate, or the strike layer over the substrate, and portions of the metal layer that are not on the raised portions of the stamp, and which are supposed to remain on the stamp and not be transferred to the substrate, or the strike layer over the substrate. To avoid such contact, various parameters may be controlled. For example, stiffer substrates and lower forces applied to the stamp are two factors that may be used to eliminate such contact. In addition, if a flexible substrate is used, the substrate may be mounted on a stiff support structure, if desired. Still other means may be used to keep the flexible substrate sufficiently rigid to maintain the desired tolerances. Another important factor is the geometry of the stamp. In particular, by increasing the depth of the depressed portions, or by decreasing the separation between the raised portions, such contact may be avoided. It is believed that a depth of about 10 microns per 1 millimeter of separation is preferred to avoid such contact, although this ratio may change depending upon the particular substrate, stamp material and forces.

The patterned stamp is then removed and the portions of the metal layer that are cold-welded to the substrate, or the strike layer over the substrate (or otherwise adhered to the substrate or whatever material is over the substrate) break away from the stamp and remain cold-welded (or adhered) to the substrate, or the strike layer (or other material) over the substrate, in substantially the same pattern as the patterned stamp. To ensure that the cold-welded metal remains over the substrate rather than breaking away from the substrate when the stamp is removed, the relative adhesion between the stamp and the metal layer thereover should preferably be smaller than the adhesion between the strike layer (or whatever material is over the substrate) and the substrate.

In one embodiment of the present invention, an adhesion-reduction layer (or adhesion-diminishing layer) is positioned between the patterned stamp and the metal layer, to lower the adhesion between the metal layer and the stamp. The adhesion-reduction layer may include for example an organic layer, a TEFLON™ layer or any other material that may reduce the adhesion between the stamp and the metal layer thereover, by being positioned between the stamp and the metal layer. Preferably, the adhesion-reduction layer should reduce the adhesion between the stamp and the metal layer thereover a sufficient amount such that the relative adhesion between the stamp and the metal layer thereover is smaller than the adhesion between the strike layer (or whatever material is over the substrate) and the substrate. Thus, when the stamp is pulled away from the substrate after the metal layer and the strike layer (or whatever material is over the substrate) are cold-welded to one another, the cold-welded metals should remain over the substrate rather than being pulled off with the stamp.

The composition and/or thickness of the adhesion-reduction layer is preferably selected to achieve the desired results. Examples of suitable adhesion-reduction layers include thin organic layers and TEFLON™. Exemplary thicknesses of the thin organic layer include, but are not limited to, those in the range of from about 25 to about 100 Å. The thin organic layer may optionally be made of $Alq_3$, which has the following formula:

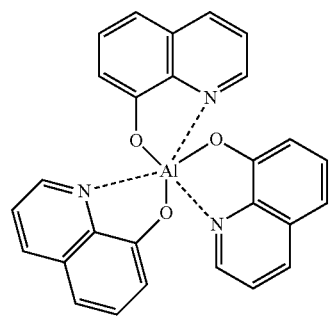

The adhesion-reduction layer is deposited over the stamp by methods known in the art. An example of one suitable method of depositing Alq3 for example, is by thermal evaporation.

In another embodiment of the present invention, at least one layer is deposited between the substrate and the strike layer. The at least one layer may be for example, at least one organic layer, which may be used for example in forming organic light emitting devices. In addition, the at least one layer between the substrate and the strike layer may include a material suitable in the formation of thin film transistors (TFTs), such as CuPc, perylene, pentacene, and other materials known in the art.

According to one embodiment, the at least one layer between the substrate and the strike layer includes an adhesion-enhancement layer, which increases adhesion between the substrate and the strike layer. Suitable materials that would perform an adhesion-enhancement function by increasing the adhesion between the substrate and the strike layer depend on the materials of the substrate and the materials of the strike layer, and would be apparent to those skilled in the art. Preferably, the adhesion-enhancement layer should increase the adhesion between the substrate and the strike layer thereover a sufficient amount such that the relative adhesion between the substrate and the strike layer thereover is greater than the adhesion between the stamp and the metal layer, or whatever material is over the stamp. Thus, when the stamp is pulled away from the substrate after the metal layer and the strike layer (or whatever material is over the substrate) are cold-welded to one another, the cold-welded metals should remain over the substrate rather than being pulled off with the stamp.

The at least one layer between the substrate and the strike layer may or may not be an organic layer. The at least one layer that is optionally deposited over the substrate between the substrate and the strike layer, may be deposited by any suitable method known in the art. For example, when the at least one layer is a polymer layer, the polymer layer may be deposited for example, using spin coating.

The thickness of the at least one layer between the substrate and the strike layer depends on the purpose for which the layer is to be used and the composition of the layer. Suitable thicknesses would be known to those skilled in the art.

In another embodiment of the present invention, a first organic layer(s) may be deposited over the metal layer previously deposited over the patterned stamp. Additionally, a second organic layer(s) may be deposited over the substrate, such that the first organic layer(s) and the metal layer may be transferred from the patterned stamp onto the second organic layer(s) over the substrate. This embodiment of the invention transferring an organic layer from the patterned stamp to another organic layer could be used, for example, to fabricate an OLED.

Due to the applied pressure in embodiments of the present invention to achieve cold-welding of metals, at least when using a rigid stamp in the methods of the present invention, potential plastic deformation of the organic layers or any other layers between the substrate and the strike layer should be taken into consideration in deciding what materials to use, the thicknesses of the materials and the amount of pressure applied.

Patterned metal layers over a substrate formed according to embodiments of the method of the present invention may be used for example, as an electrode or bus line in electrical devices. For example, the patterned metal layer may be used as a cathode layer or an anode layer in organic light emitting devices (OLEDs) or stacked organic light emitting devices (SOLEDs) as described for example in U.S. Pat. No. 5,707,745.

After the patterned metal is transferred over a substrate, other layers over the substrate may be selectively removed based on the purpose of the patterned metal layer. For example, the portions of the strike layer that are not covered by the patterned metal layer, may be removed by sputtering or other methods known in the art. In addition, in another embodiment of the invention, the portions of the strike layer that are not covered by the patterned metal layer are not removed. For example, this may be desirable if the fabricated device is to have a substrate with a metal film thickness variation such that in some areas of the metal film one thickness is needed, and in other areas of the metal film another thickness is needed. Such a variation of the metal film thickness could be achieved by not removing the portions of the strike layer that are not covered by the patterned metal layer.

In embodiments where an organic layer is positioned between the substrate and the strike layer, if desired, after the portions of the strike layer that are not covered by the patterned metal are removed, the portions of the organic layer that are not covered by the patterned metal may also be removed by methods known in the art. Portions of the organic layer may be removed for example, by etching. A non-limiting example of a suitable form of etching is plasma etching or reactive ion etching (such as anisotropic etching), for example with $O_2$ or a combination of $CF_4$ and $O_2$ to remove the exposed organic layers, i.e., the parts of the organic layers not covered by the patterned metal layer.

Similarly, in embodiments where an adhesion-enhancement layer is positioned between the substrate and the strike layer, if desired, after portions of the strike layer that are not covered by the patterned metal layer are removed, the portions of the adhesion-enhancement layer that are not covered by the patterned metal layer may be removed by methods known in the art depending on the composition of the adhesion-enhancement layer.

In embodiments where any other layers are positioned between the substrate and the strike layer, if desired, after the portions of the strike layer that are not covered are removed, the portions of the layers that are not covered by the patterned metal layer may also be removed by methods known in the art.

Additionally, if desired, according to one embodiment of the invention, portions of all layers over the substrate that are not covered by the patterned metal layer are selectively removed and subsequently the portions of the substrate that are not covered by the metal layers are etched to form a patterned substrate. The form of etching may depend on the composition of the substrate. Suitable forms of etching may include anisotropic etching and other forms of etching known in the art.

According to this embodiment, after the substrate is patterned any portions of layers remaining over the substrate, including the patterned metal layer, may optionally then be removed from the substrate to yield an uncovered patterned substrate. The removal of the remaining portions of layers may be accomplished by any method known in the art, such as for example, via application of a suitable wet chemical for removing whatever material is being removed. Preferably, this removal does not damage the other portions of layers which are to remain over the substrate, such as remaining organic layers.

Embodiments of the method of the present invention in which a patterned metal layer remains over the substrate, may result in a patterned metal layer having a grating line pattern of, for example, about 80 nm wide. In addition, the patterned metal layer can have a resolution of, for example, at least about 100 nm. Regarding the edge sharpness, the patterned metal layer can have a line width of, for example, about 30 nm.

One embodiment of the present invention includes a method of patterning a substrate, which includes depositing an adhesion-enhancement layer, such as, for example, an organic layer, over a substrate; depositing a strike layer comprising a thin metal film over the organic layer; pressing a patterned, soft elastomeric stamp having at least one raised portion and having a metal layer deposited thereover onto the thin metal film, such that the metal layer over the raised portion of the patterned, soft elastomeric stamp contacts portions of the thin metal film over said substrate, and applying sufficient pressure such that the metal layer and the thin metal film cold weld to one another. According to this embodiment, the patterned, soft elastomeric stamp is then removed, and the metal layer is cold-welded to portions of the thin metal film with which it has contact, i.e., it detaches from the patterned stamp and remains cold-welded to the thin metal film over the substrate. The metal transferred to the thin metal film forms a patterned metal layer over the substrate in substantially the same pattern as the at least one raised portion of the soft elastomeric stamp. Next, according to the method of this embodiment, portions of the thin metal film that are not covered by the patterned metal layer are removed, for example by sputtering. Then, portions of the organic layer that are not covered by the patterned metal layer are removed, for example by etching. The portions of the substrate that are not covered by the patterned metal layer are etched to form a patterned substrate. Lastly, according to this embodiment, the patterned metal layer and the remaining portions of the thin metal film and the organic layer from said patterned substrate are removed to arrive at an uncovered patterned substrate.

An embodiment of the present invention further relates to devices formed using the methods of the present invention. Such devices include devices containing metal layers patterned by the described methods and devices in which patterned metal layers using the described methods were used in the fabrication thereof, for example as a mask layer.

Figure 7:
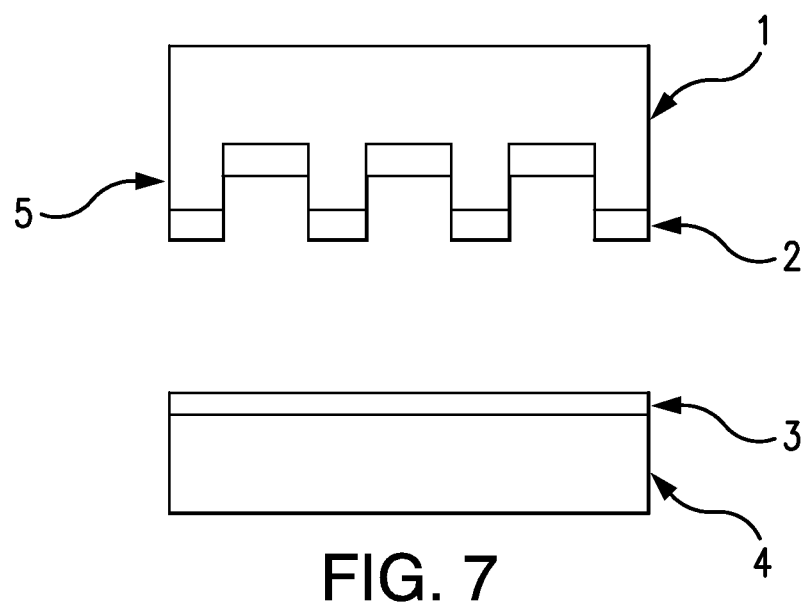
FIG. 7 shows a cross-section of a patterned stamp adapted for use with an embodiment of the present invention and a substrate, wherein a patterned metal layer will be transferred from the stamp to the substrate by cold-welding metal over the stamp to portions of a thin metal film over the substrate.

FIG. 7 shows a cross-section of a stamp 1 adapted for use with an embodiment of the present invention and a substrate 4 over which a metal layer is to be patterned. Stamp 1 is preferably formed of a soft elastomeric substance such as PDMS. Stamp 1 has raised portions 5, which may be formed using techniques known in the art, depending on the composition of the stamp, such as silicon patterning and etching processes. The stamp 1 has a metal layer 2 deposited over at least the raised portions 5 of the stamp using techniques known to the art. In addition to using stamp 1 from FIG. 7, stamp 1a as depicted in FIG. 15 may be used having raised portions 5a. The shape of stamp 1a helps avoid side wall deposition of a metal when the metal layer 2 is deposited over the stamp 1a. Each time "stamp 1" and "raised portions 5" are referred to in the description of the figures, it should be understood that stamp 1a and raised portions 5a may be substituted therefor. It is also to be understood that the stamp may be other shapes not specifically depicted so long as it is patterned so as to be capable of transferring a patterned metal layer to a substrate.

In the embodiment depicted in FIG. 7, substrate 4 has a thin metal film 3 (which comprises a strike layer) deposited thereover using techniques known in the art. Substrate 4 may be made of any suitable material, including glass, polymers, and plexiglass. Substrate 4 may be rigid, flexible, opaque or transparent. Preferably, substrate 4 is made of a substantially transparent material such as glass or plastic. The metal layer 2 includes a metal that is capable of cold-welding to the thin metal film 3 on compression of the metal layer 2 against the thin metal film 3. Preferably, the metal layer 2 and the thin metal film 3 are non-reactive metals, such as silver and gold.

Stamp 1 is pressed onto the thin metal film 3, and the portions of the metal layer 2 over the raised portions 5 of stamp 1 contact portions of the thin metal film 3. Sufficient pressure is applied such that the portions of the metal layer 2 that contact portions of the thin metal film 3 cold-weld thereto.

Figure 8:
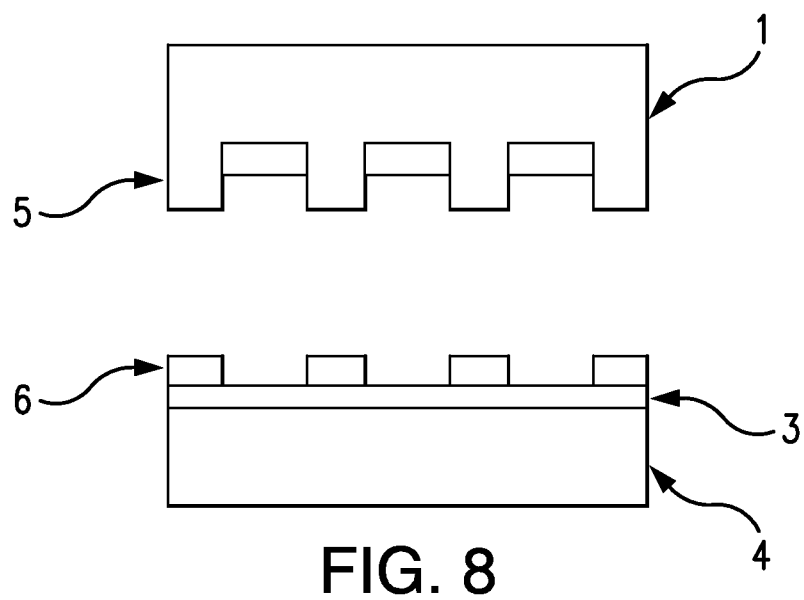
FIG. 8 shows a cross-section of the stamp and the substrate of FIG. 7 after portions of the metal from the stamp have been transferred to the substrate in accordance with an embodiment of the method of the present invention.

The stamp 1 is then removed and the portions of the metal layer 2 that are cold welded to the thin metal layer 3, remain cold welded to the thin metal layer 3 and break away from the stamp, leaving a patterned metal layer 6 (as seen in FIG. 8) over the substrate.

FIG. 8 shows a cross-section of the stamp 1 and the substrate 4 of FIG. 7 after portions of the metal from the stamp have been transferred to the substrate to form a patterned metal layer 6 over the thin metal film 3, in accordance with embodiments of the methods of the present invention.

Figure 9A:
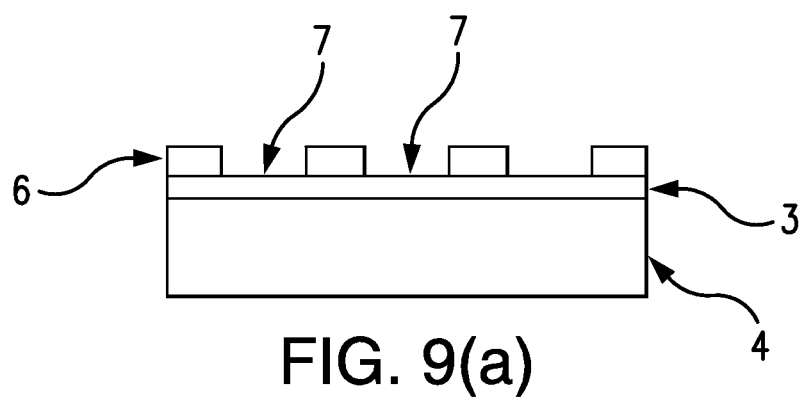
FIG. 9 shows a cross-section of the substrate of FIG. 8 having the patterned metal thereover, before (FIG. 9(a)) and after (FIG. 9(b)) portions of the thin metal film are removed in accordance with one embodiment of the present invention.

FIG. 9(a) shows a cross-section of the substrate 4 of FIG. 8 having the patterned metal 6 thereover. Depending on the specific type of device being made, it may be desirable to remove the portions 7 of the thin metal film 3 that are not covered by the patterned metal. For example, in order for the substrate to be patterned, the uncovered portions 7 of thin metal film 3 must be removed before one can get to the substrate to etch it, for example. The uncovered portions 7 of the thin metal film 3 may be removed for example, by sputtering to yield a substrate having the patterned metal layer 6 and corresponding portions of a thin metal film thereover, as depicted in FIG. 9(b).

Figure 9B:
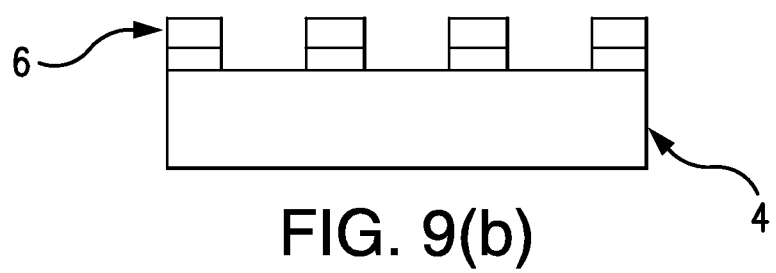
Figure 10A:
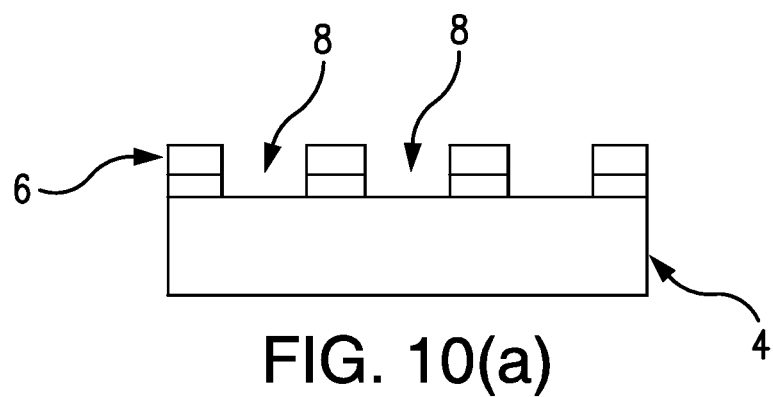
FIG. 10 shows a cross-section of the substrate of FIG. 9(b) having the patterned metal thereover, before (FIG. 10(a)) and after (FIG. 10(b)) portions of the substrate are etched to form a patterned substrate having essentially the same pattern as the stamp in accordance with another embodiment of the present invention.
Figure 10B:
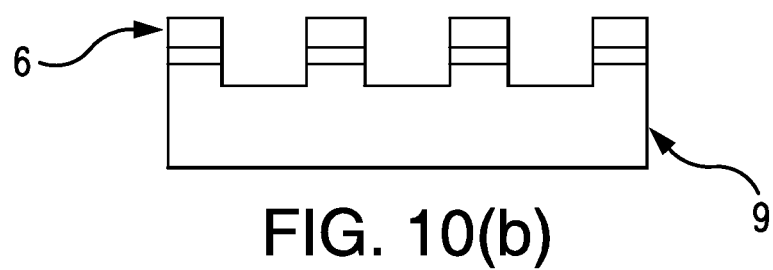

FIG. 10(a) shows a cross-section of the substrate of FIG. 9(b) having the patterned metal and corresponding patterned thin metal film thereover. According to one embodiment of the present invention, if desired, the substrate may then be patterned, for example, by anisotropic etching the portions of the substrate 8 that are uncovered by the patterned metal, to yield the patterned substrate depicted in FIG. 10(b). The pattern of the patterned substrate of FIG. 10(b) essentially corresponds to the pattern of the stamp 1 that was used to transfer the metal over the substrate.

Figure 11A:
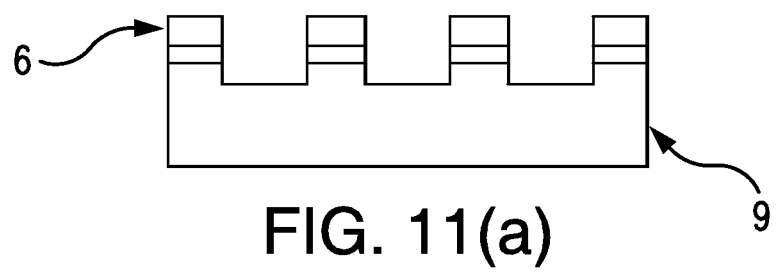
FIG. 11 shows a cross-section of the substrate of FIG. 10(b) having the patterned metal thereover, before (FIG. 11(a)) and after (FIG. 11(b)) the remaining thin metal film and patterned metal layer are removed from the patterned substrate.
Figure 11B:
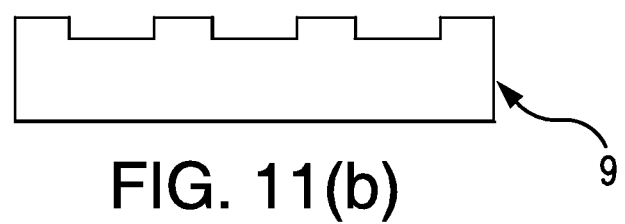

According to a further embodiment of the present invention, if desired, the patterned layers over the patterned substrate as depicted in FIG. 11(a) may then be removed from the substrate to yield an uncovered patterned substrate 9 as depicted in FIG. 11(b). Such layers may be removed for example by use of a suitable wet chemical depending on the composition of the layers that are being removed.

Figure 12:
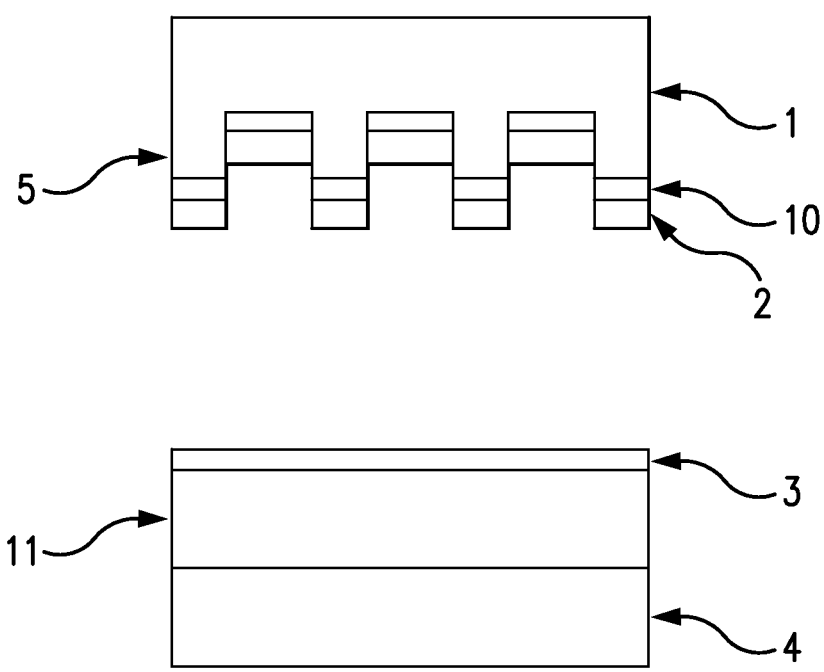
FIG. 12 shows a cross-section of a patterned stamp adapted for use with an embodiment of the present invention having an adhesion-diminishing layer between the stamp and the metal layer thereover, and a substrate over which a metal material is to be patterned by cold-welding the metal over the stamp to the thin metal film over the substrate, in which an organic layer is positioned between the substrate and the thin metal film.

FIG. 12 shows a cross-section of a patterned stamp 1 adapted for use with an embodiment of the present invention having an adhesion-reduction layer 10, made of for example, a thin organic layer or TEFLON™, between the stamp 1 and the metal layer 2 thereover. Stamp 1 is preferably made of a soft, elastomeric material, and has raised portions 5, which may be formed using techniques known in the art, depending on the composition of the stamp. FIG. 12 also shows a cross-section of a substrate 4 having a thin metal layer 3 (which comprises a strike layer) over the substrate and a layer 11 positioned between the substrate and the thin metal layer 3. Layer 11 may include an organic or inorganic material and may be a single layer or a plurality of layers. For example, layer 11 may include the multiple organic layers of a single or double heterostructure OLED, as described in U.S. Pat. No. 5,707,745, which is incorporated by reference herein in its entirety. The layer 11 and the thin metal layer 3 are deposited over the substrate 4 using techniques known in the art. The substrate 4 and stamp 1 may be made of similar materials as those set forth with regard to FIG. 7. Likewise, the thin metal layer 3 and the metal layer 2 may include the metals described with regard to FIG. 7. Stamp 1 is pressed onto the thin metal layer 3, and the portions of the metal layer 2 over the raised portions 5 of stamp 1 contact portions of the thin metal layer 3. Sufficient pressure is applied such that the portions of the metal layer 2 that contact portions of the thin metal layer 3 cold-weld thereto.

The stamp 1 is then removed and the portions of the metal layer 2 that are cold welded to the thin metal layer 3, remain cold-welded to the thin metal layer 3 and break away from the stamp, leaving a patterned metal layer 6 over the substrate (as can be seen in FIG. 13).

FIG. 13 shows a cross-section of the stamp 1 and the substrate 4 of FIG. 12 after portions of the metal from the stamp have been transferred to the substrate 4 in accordance with an embodiment of the method of the present invention to form a patterned metal layer 6 over the substrate 4, in accordance with an embodiment of the present invention.

The substrate 4 of FIG. 13 having the patterned metal layer 6 thereover can be subsequently patterned employing the same processes discussed above and shown in FIGS. 9-11. That is, sputtering, anisotropic etching and wet chemicals, for example, can be employed to remove certain layers and pattern the embodiment as desired.

FIG. 13(a) shows optical microscope images of an array of 200-μm-diameter cathodes for organic light-emitting devices which were fabricated according to an embodiment of the method of the present invention. The image shown in FIG. 13(a) was taken after metal transfer from the stamp and the removal of the strike layer. The uniform pattern was obtained over the whole substrate area. FIG. 13(b) shows a scanning electron microscope image showing the edge of a cathode, where the pattern resolution is about 1 μm, primarily due to the non-ideal stamp shape as shown in FIG. 3.

Figure 14:
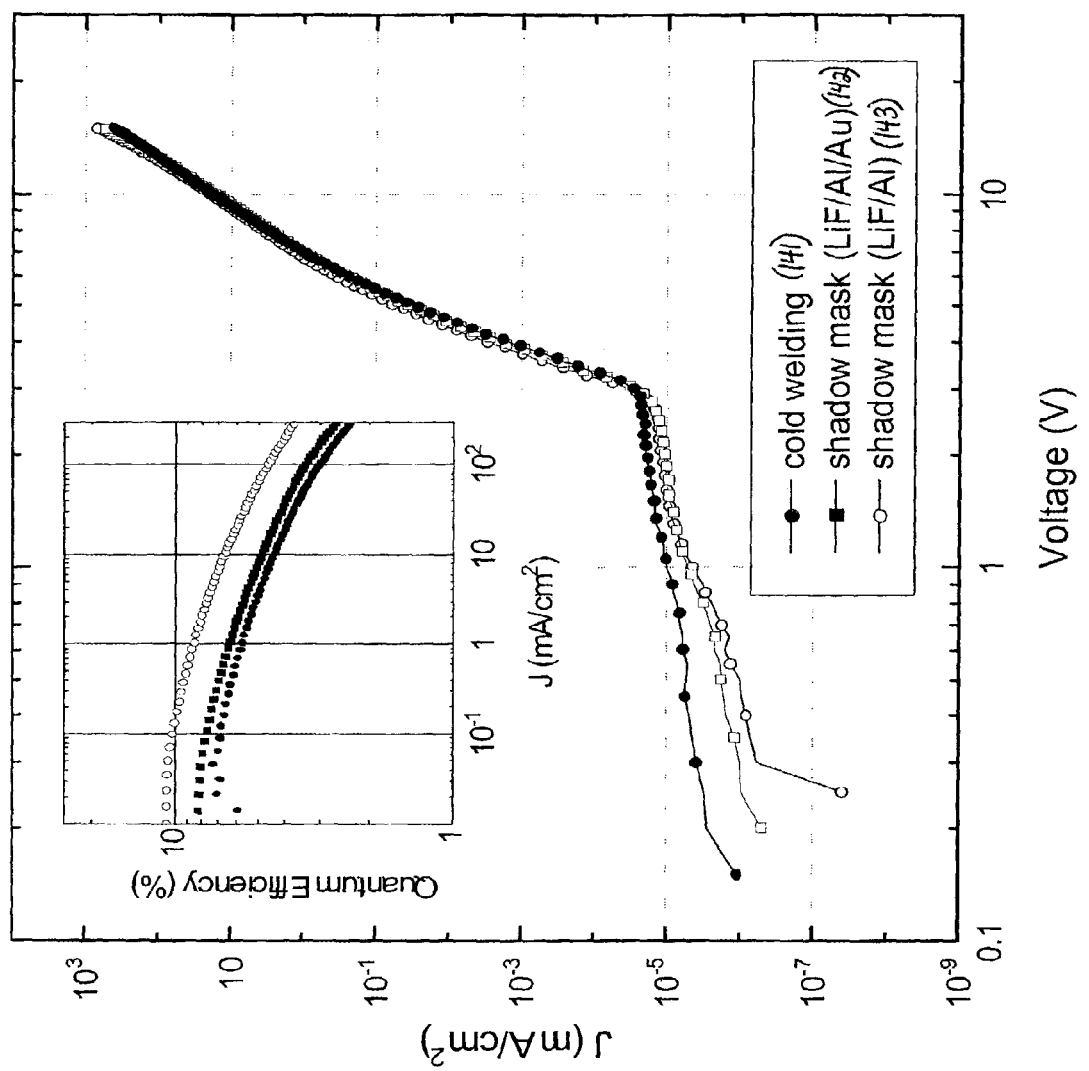
FIG. 14 shows the current density (J) vs. voltage (V) characteristics of a 200-μm-diameter organic light-emitting device (OLED) patterned by cold welding (solid circles).

FIG. 14 shows the current density (J) vs. voltage (V) characteristics of a 200-μm-diameter organic light-emitting device (OLED) 141 patterned by cold welding (solid circles) according to an embodiment of the method of the present invention. The completed cathode consists of 0.5 nm LiF/0.4 nm Al/15 nm Au. Also shown are J-V characteristics for 400-µm-diameter OLEDs 142, 143 patterned by conventional shadow mask methods (open circles (143): a device with a bilayer cathode consisting of 0.5 nm LiF/100 nm Al; solid squares (142): an OLED with the cathode identical to that of the stamped device). The inset to FIG. 14 shows a plot of external quantum efficiency vs. current density for the devices in FIG. 14.

In an embodiment of the present invention, the stamp should be properly positioned during the stamping process. In particular, the stamp should be positioned accurately with respect to features already over the substrate 4 during the stamping illustrated, for example, in FIGS. 7, 8 and 12. This alignment may be achieved using techniques known in the art, such as optical alignment using IR light projected through the bottom of the substrate 4, fiducial alignment using light scattering, and any other suitable technique.

Although various embodiments of the invention are illustrated with simplified organic layers and metal layers, additional layers and sublayers may be present, including both organic layers and metal layers. For example, layers between the substrate and the strike layer (e.g., the layer 11 depicted in FIG. 12) may include multiple sublayers, and additional layers may also be present between the substrate and the strike layer. For example, in an embodiment of the invention, an organic layer comprising a hole transporting layer, an electron blocking layer, an emissive layer, a hole blocking layer, and an electron transporting layer can be deposited over the substrate, and a strike layer can be deposited over the organic layer, such that the metal layer from the stamp is transferred onto the strike layer. For another example, a patterned bottom electrode may be fabricated over the substrate 4 prior to depositing an organic layer, such as for example, the organic layer described in the preceding sentence. Additional organic layers, such as a hole injecting layer, may also be present, such as described in U.S. Pat. No. 5,998,803 to Forrest et al., which is incorporated herein by reference in its entirety. Additional layers as known in the art may also be present, such as those described on pages 6-11 of U.S. patent application Ser. No. 10/288,785 (filed Nov. 6, 2002), which is incorporated herein by reference in its entirety.

An embodiment of the present invention includes fabricating transparent or top-emitting OLEDs that exploit the high optical transmission of compound cathodes, such as Mg:Ag/ITO, in a passive matrix display, but without having such devices limited by the lower electrical conductivity of such compound cathodes by the use of bus lines deposited by the present methods. Furthermore, an embodiment of the present invention provides vapor deposited, electrically conductive materials without encountering the shorting problems that may be experienced whenever such electrically conductive materials undergo substantial scattering during the deposition process.

Some OLED applications may involve side-emitting OLEDs, in which case both electrodes may be non-transparent. Although the electrodes, organic layer and barrier layer are described and illustrated as single layers, they may each include various sublayers as known in the art. For example, the organic layer may include the sublayers of a single or double heterostructure OLED, as described in U.S. Pat. No. 5,707,745, which is incorporated herein by reference in its entirety. In addition, embodiments of devices of the present invention may include additional layers known in the art that are not illustrated, such as for example, a hole injection enhancement layer or a protective top layer.

Devices fabricated in accordance with an embodiment of the present invention may be incorporated into a wide variety of products. For example, a large, multi-color array of organic light emitting devices (OLEDs), fabricated using embodiments of the method of the present invention to deposit electrical contacts and/or organic layers of the OLED, may form a display, including flat panel displays, both active-matrix and passive-matrix displays. Such a display may be incorporated into other products, such as a vehicle, a television, a computer, a printer, a screen, a sign, a telecommunications device or a telephone, in a manner known to one of skill in the art.

OLEDs fabricated in accordance with an embodiment of the present invention may also be used for applications other than displays. For example, a line of such OLEDs could be incorporated into a printer, and used to generate images, in a manner known to one of skill in the art.

An embodiment of the present invention may also be used to fabricate a wide variety of devices in addition to OLEDs. For example, the present methods may be used to fabricate thin film transistors, photodetectors and other devices in which a high resolution is desired. Embodiments of the present invention may be used to fabricate opto-electronic devices as well, such as arrays of photovoltaic cells or photodiodes.

The present invention will now be described in detail with respect to showing how certain specific representative embodiments thereof can be made, the materials, apparatus and process steps being understood as examples that are intended to be illustrative only. In particular, the invention is not intended to be limited to the methods, materials, conditions, process parameters, apparatus and the like specifically recited herein.

EXAMPLES

Example 1

A method according to an embodiment of the present invention for the direct patterning of metal over a substrate by stamping was performed. Specifically, a method for high resolution patterning of metal cathode contacts for organic electronic devices using low pressure cold welding was performed. In this example, the contacts are formed by transferring a metal layer from a patterned, soft elastomeric stamp onto unpatterned organic and metal layers predeposited onto a substrate. According to the method of the invention embodied in this example, an array of efficient electrophosphorescent organic light emitting devices (OLEDs) was fabricated.

In this example, a method as shown in FIG. 2 was used. FIG. 2 describes the cold welding process used to pattern an array of electrophosphorescent OLEDs. The substrate 104 was comprised of a (12 mm)$^2$ glass slide. The substrate 104 was pre-coated with a transparent and conductive layer of indium tin oxide (ITO), which served as the anode of the OLED structure. Organic layers 111 were deposited over the ITO layer as follows (as described in M. A. Baldo et al., *Appl. Phys. Lett.* (1999), 75, 4): about 60-nm-thick hole transporting layer of 4,4'-bis[N-(1-napthyl)-N-phenyl-amino] biphenyl (α-NPD); about 20-nm-thick light-emitting layer of 4,4'-N,N'-dicarbazole-biphenyl (CBP) doped at 7% by weight with the guest phosphor, fac tris(2-phenylpyridine) iridium (Ir(ppy)$_3$); about 10-nm-thick exciton and hole blocking layer of 2,9-dimethyl-4,7-diphenyl-1,10-phenanthroline (BCP); and an about 40-nm-thick electron transporting layer of Alq$_3$. A strike layer 103 comprising an about 0.5-nm-thick layer of LiF, an about 0.4-nm-thick layer of Al, and capped by an about 15-nm-thick layer of Au, was then deposited over the 0organic layers 111. Prior to the depositions, the substrate 104 was cleaned by the procedure previously described in P. E. Burrows et al., *J Appl. Phys.* (1996), 79, 7991, and the organic layers 111 and strike layer 103 for the OLEDs were deposited by high vacuum (~$10^{-6}$ Torr) thermal evaporation. All of the organic materials used for OLEDs were purified by thermal gradient sublimation before use.

A patterned, soft, elastomeric stamp 101 comprised an about 100-μm-thick layer of PDMS patterned with raised portions 105, and was supported on a glass slide. A 25-μm-thick photoresist layer (SU-8 50, MicroChem Corporation, Newton, Mass. 02464) on a Si wafer was patterned into a square lattice of 200-μm diameter cylindrical recesses by conventional photolithography to form the master for the PDMS stamp (see FIG. 6(a)). PDMS prepolymer (Sylgard 184, Dow Corning Corporation, Midland, Mich. 48686) was poured into the master, and then cured on a hot plate at about 70° C. for about 24 hours while being pressed with a 13-mm-thick glass slide. The thickness of the PDMS layer was about 100 μm. Pressing was done using a conventional semiconductor flip-chip bonder (M-BHP, Research Devices, Inc., Piscataway, N.J. 08854) (see FIGS. 6(b) and 6(c)).

A layer 110 comprising an about 100-nm-thick layer of 2,9-dimethyl-4,7-diphenyl-phenanthroline ("bathocuproine" or "BCP") was deposited over the stamp 101, and a metal layer 102 was deposited over the layer 110. In this embodiment of the invention, the addition of the BCP layer 110 serves to smooth out the metal layer 102 in its adhesion thereto, as compared to if the metal layer 102 was directly adhered to PDMS stamp 101. The metal layer 102 was comprised of an about 100-nm-thick layer of Au.

The stamp 101 was pressed onto the strike layer 103 such that the portions of the metal layer 102 over the raised portions 105 of the stamp 101 contacted portions of the strike layer 103 (see FIG. 2(a)). Sufficient pressure was applied to the stamp 101 such that the portions of the metal layer 102 over the stamp 101 that contacted portions of the strike layer 103 cold-welded to the strike layer 103. In this example, the average applied pressure was approximately 180 kPa (corresponding to 500 g over the contact area of 0.28 cm$^2$), which is about 1000 times lower than that previously reported with a rigid stamp (see C. Kim et al., *Science* (2000), 288, 831; C. Kim et al., *Appl. Phys. Lett.* (2002), 80, 4051).

As shown in FIG. 2(b), the patterned, soft, elastomeric stamp 101 was then removed and the portions of the metal layer 102 from over the stamp 101 that cold-welded to the strike layer 103 remained cold-welded and broke away from the stamp 101, leaving a patterned gold layer over the substrate 104.

Next, as shown in FIGS. 2(b) and 2(c), the uncovered portions 107 of the strike layer 103 between the transferred pattern were removed by Ar sputter etching in a conventional reactive ion etch system. Ar sputter etching was carried out in a parallel-plate (diameter of about 24 cm) reactive ion etch system (PlasmaTherm 970 series) for 9 minutes at 20 mTorr and 50W. The device characteristics were measured under ambient conditions. In the devices of this example, it was not necessary to remove the organic material between the transferred pattern, as the devices were well isolated due to the high lateral resistivity of the organics. However, a different gas composition can be used to remove the organic material as well, if so required.

Both before and after the patterned gold layer was transferred onto a substrate as set forth above, in accordance with an embodiment of the present invention, scanning electron microscope (SEM) images were taken of the patterned, soft, elastomeric stamp 101. These SEM images are shown in FIG. 3. A detailed view (FIG. 3(b)) of the PDMS post reveals that the stamp edge is rounded, resulting in a continuous Au coating along its top corner. When the stamp was separated from the substrate, the Au film was irregularly fractured along this boundary (FIG. 3(c)). The Au pattern was uniformly transferred to the substrate over the whole substrate area with a transfer yield exceeding 97%, and the pattern edge resolution was approximately 1 μm. The resolution was primarily limited by the rounded edges of the stamp posts, leading to irregular edge transfer, as shown in FIG. 13.

FIG. 14 shows the results of a comparison between the electrical and optical performance of an electrophosphorescent OLED 141 formed by cathode stamping (i.e., in accordance with embodiments of the method of the present invention) and that of a control device patterned by conventional shadow mask methods. Two types of control devices were prepared: one 142 with an identical cathode layer structure to the stamped devices of Example 1 (~0.5 mn LiF/~0.4 nm Al/~15 nm Au), and the other 143 with a bilayer cathode consisting of a 0.5-nm-thick layer of LiF followed by a 100-nm-thick layer of Al. The diameter of the control devices was 400 gm, or twice that of the stamped OLEDs of Example 1.

The measurements in FIG. 14 show that the stamping and strike layer removal processes do not affect the device performance even though pressure is applied directly to the active area of the organic heterostructure during stamping. For example, the voltage corresponding to a current density of J=10 mA/cm$^2$ was (9.2±0.3) V for both stamped and control devices, and the external quantum efficiencies ($\eta$) at J=1 mA/cm$^2$ of the stamped and control devices with the same cathode structure were (6.0±0.3) %. Note that this is about 70% of that for the control device with the bilayer cathode. The shapes of $\eta$-J curves are nearly identical, indicating that our process does not introduce additional routes leading to nonradiative loss of excitons. The difference in $\eta$ for devices with the trilayer and bilayer cathode structures may be due to the difference in reflectivity of Au and Al. We calculated that n for the device with the Au cap layer is about 83% of that for the device with the Al cap. In the calculation, the ultrathin LiF/Al layer was ignored, and light emitted from an isotropic source was summed with light reflected from the cathode. In this case, we employed the complex refractive indices of contact materials, as would be understood by one of skill in the art. From these simple considerations, therefore, we conclude that the difference in the efficiencies between the bilayer and stamped trilayer cathodes apparent in FIG. 14 are primarily the result of the difference in reflectivity of Au and Al.

In Example 1, the pattern size was 200 μm, with an edge resolution of about 1 μm. H. Schmid et al., *Macromolecules* (2000), 33, 3042, previously reported that PDMS is too soft for patterning features smaller than 500 nm. This problem has been overcome by employing "hybrid stamps" or "composite stamps," where the pattern shape is formed in an outer layer of a stiffer polymeric composite such as 'h-PDMS', while a softer inner layer (such as PDMS) provides conformability (see H. Schmid et al., *Macromolecules* (2000), 33, 3042; T. W. Odom et al., *Langmuir* (2002), 18, 5314). With this approach, this embodiment of the method of the present invention will be capable of low pressure patterning of metal films with sub-micron features. An additional aspect of low pressure patterning is its compatibility with conventional semiconductor flip-chip bonders such as that used in the current example. This allows for precise (~1 μm) stamp positioning accuracy, making high resolution multi-level stamping of full color displays, for example, achievable by this simple method.

Embodiments of the method of the present invention have several advantages over previously reported patterning techniques. For example, the present method is very cost-effective, because the stamps are reusable. Preferably, any metal remaining on the stamp is left on the stamp and additional new metal may be added to the stamp as desired or needed. In addition, if removal of any metal remaining on the stamp is desired, such metal may be removed by methods known to those skilled in the art. The metal may be removed for example, by wet etching.

Embodiments of the method of the present invention are also advantageous over previously reported patterning techniques because the present invention offers high throughput. Large areas, such as display panels, can be patterned in one step.

Furthermore, unlike other patterning processes based on material transfer, the embodiments of the method of the present invention are capable of metal patterning without the use of wet chemical or high temperature processes. In addition, since the metal-organic interface is formed by thermal evaporation similar to that used in conventional shadow masking, efficient charge injection into organic materials is not affected by the process, as shown in FIG. 14 herein. This property, combined with the low pressure patterning capability, make this method suitable for roll-to-roll fabrication processes of a wide range of organic electronic devices including OLEDs, organic thin-film transistors, and photovoltaic cells. By using roller stamps, large area patterning can be performed more easily for flexible substrates, since optimum pressure can be applied with smaller forces due to decreased contact areas. Embodiments of the method of the present invention allow simple, cost-effective and high throughput fabrication of OLEDs and other electronic devices and can be applied to the fabrication of flat panel displays, for example.

While the present invention is described with respect to particular examples and preferred embodiments, it is understood that the present invention is not limited to these examples and embodiments. In particular, the present invention is not limited to OLEDs, or thin film transistors and may be applied to a wide variety of electronic devices. In particular, embodiments of the method of the present invention may be used in forming any device in which a patterned metal or organic layer is used in the device itself or in the formation of the device, for example as an etching mask in patterning other layers or the substrate. The present invention is not limited to the particular examples and embodiments described. The present invention as claimed therefore includes variations from the particular examples and preferred embodiments described herein, as will be apparent to one of skill in the art.

What is claimed is:

1. A method of fabricating an organic device, comprising:
   depositing a first organic layer onto a patterned, soft elastomeric stamp; and
   transferring the first organic layer from the patterned, soft elastomeric stamp onto a substrate by cold welding a layer deposited over the patterned, soft elastomeric stamp to a layer on the substrate or to the substrate.

2. The method of claim 1, wherein the first organic layer comprises an active component of the device.

3. The method of claim 1, further comprising:
   prior to depositing the first organic layer, depositing an adhesion-reduction layer over the patterned, soft elastomeric stamp, such that the first organic layer is deposited over the adhesion -reduction layer.

4. The method of claim 1, further comprising:
   prior to depositing the first organic layer, depositing a metal layer over the patterned, soft elastomeric stamp, such that the first organic layer is deposited over the metal layer.

5. The method of claim 1, further comprising:
   prior to transferring the first organic layer onto the substrate, depositing a second organic layer over the substrate, such that the first organic layer from the patterned, soft elastomeric stamp is transferred onto the second organic layer such that the first organic layer is in direct contact with the second organic layer during the transfer.

6. The method of claim 5, wherein the first organic layer is transferred from the patterned, soft elastomeric stamp onto the second organic layer by applying a pressure of about 180 kPa or less.

7. The method of claim 1, wherein the patterned, soft elastomeric stamp is a hybrid stamp.

\* \* \* \* \*